US012702007B2

(12) United States Patent
Li et al.

(10) Patent No.: US 12,702,007 B2
(45) Date of Patent: Aug. 4, 2026

(54) MULTILEVEL PACKAGE SUBSTRATE FOR INTERLEVEL DIELECTRIC CRACK MITIGATION

(71) Applicant: Texas Instruments Incorported, Dallas, TX (US)

(72) Inventors: Guangxu Li, Allen, TX (US); Sylvester Ankamah-Kusi, Dallas, TX (US); Rajen Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 342 days.

(21) Appl. No.: 18/344,722

(22) Filed: Jun. 29, 2023

(65) Prior Publication Data

US 2025/0006661 A1     Jan. 2, 2025

(51) Int. Cl.
*H10W 42/00* (2026.01)
*H10W 70/05* (2026.01)
(Continued)

(52) U.S. Cl.
CPC ......... *H10W 42/121* (2026.01); *H10W 70/05* (2026.01); *H10W 70/65* (2026.01); *H10W 70/685* (2026.01); *H10W 72/072* (2026.01); *H10W 72/07236* (2026.01); *H10W 72/222* (2026.01); *H10W 72/248* (2026.01); *H10W 72/252* (2026.01); *H10W 90/724* (2026.01)

(58) Field of Classification Search
CPC .............. H01L 23/562; H01L 21/4857; H01L 23/49822; H01L 23/49838; H01L 24/13; H01L 24/14; H01L 24/16; H01L 24/81; H01L 2224/13082; H01L 2224/14152; H01L 2224/16227; H01L 2224/81815; H01L 23/49827; H10W 42/121; H10W 70/05; H10W 70/65; H10W 70/685; H10W 72/072; H10W 72/07236; H10W 72/222; H10W 72/248; H10W 72/252; H10W 90/724; H10W 70/635
See application file for complete search history.

(56) References Cited

U.S. PATENT DOCUMENTS

| | | | |
|---|---|---|---|
| 11,211,350 B2 * | 12/2021 | Hsu | H01L 25/0655 |
| 2024/0203893 A1 * | 6/2024 | Tsai | H01L 21/568 |
| 2025/0201689 A1 * | 6/2025 | Williamson | H01L 21/4857 |

* cited by examiner

*Primary Examiner* — Douglas W Owens
(74) *Attorney, Agent, or Firm* — Ronald O. Neerings; Frank D. Cimino

(57) ABSTRACT

An electronic device includes a multilevel package substrate and a semiconductor die, where the multilevel package substrate has first and second levels in respective first and second planes in a stack, the first level including a first conductive feature, and the second level including a second conductive feature, and the semiconductor die has a conductive peripheral terminal, a conductive interior terminal, a peripheral region, and an interior region. The peripheral region laterally surrounds the interior region and extends laterally between the interior region and the lateral sides of the semiconductor die, the conductive peripheral terminal extends from the peripheral region to the first level, the conductive interior terminal extends from the interior region to the first level, the peripheral terminal is coupled to a peripheral contact portion of the first conductive feature, and the second level has no conductive feature under the peripheral contact portion.

20 Claims, 21 Drawing Sheets

(51) Int. Cl.
H10W 70/65 (2026.01)
H10W 70/685 (2026.01)
H10W 72/00 (2026.01)
H10W 72/20 (2026.01)
H10W 90/00 (2026.01)

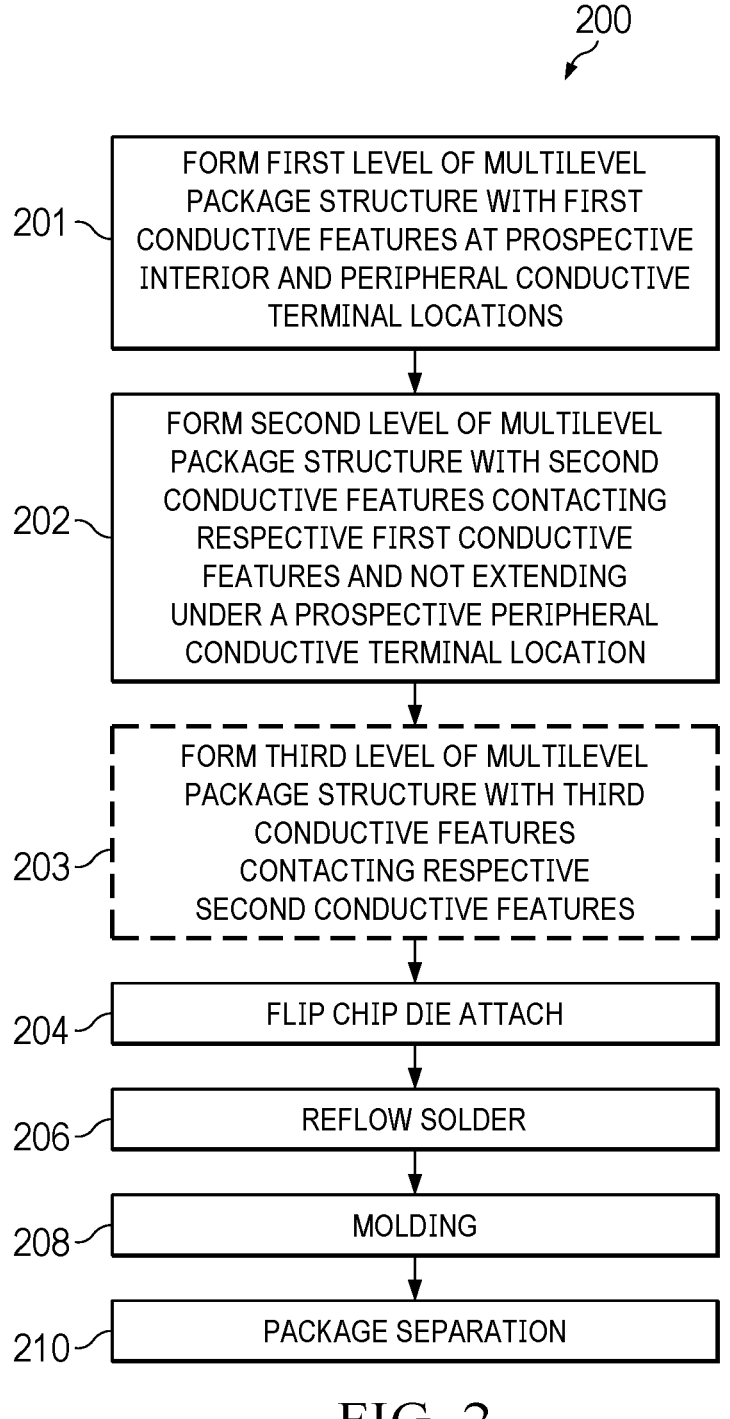

200

201 — FORM FIRST LEVEL OF MULTILEVEL PACKAGE STRUCTURE WITH FIRST CONDUCTIVE FEATURES AT PROSPECTIVE INTERIOR AND PERIPHERAL CONDUCTIVE TERMINAL LOCATIONS

202 — FORM SECOND LEVEL OF MULTILEVEL PACKAGE STRUCTURE WITH SECOND CONDUCTIVE FEATURES CONTACTING RESPECTIVE FIRST CONDUCTIVE FEATURES AND NOT EXTENDING UNDER A PROSPECTIVE PERIPHERAL CONDUCTIVE TERMINAL LOCATION

203 — FORM THIRD LEVEL OF MULTILEVEL PACKAGE STRUCTURE WITH THIRD CONDUCTIVE FEATURES CONTACTING RESPECTIVE SECOND CONDUCTIVE FEATURES

204 — FLIP CHIP DIE ATTACH

206 — REFLOW SOLDER

208 — MOLDING

210 — PACKAGE SEPARATION

FIG. 2

MULTILEVEL PACKAGE SUBSTRATE FOR INTERLEVEL DIELECTRIC CRACK MITIGATION

BACKGROUND

Multilevel package substrates of an electronic device have multiple levels with metal features in a stacked arrangement for signal and power routing and interconnections between a circuit of a semiconductor die and circuitry of a host circuit board or system. However, performance degradation and possible device failure can result from interfacial delamination and cracking in the interlayer or interlevel dielectric (ILD) material of a semiconductor die metallization structure. Such problems can be caused by poor fracture strength and brittle mechanical behavior for ILD layers, leading to high peeling stress during temperature cycling for flip chip die on multilevel package substrates with multiple trace layers. Increasing the die top metal layer thickness can help, but this adds to device height and cost, and can adversely affect electrical circuit performance. Other approaches include redesigning the materials of the die metallization structure to increase interfacial adhesion or redesigning the terminal layout of the flip chip die, but these approaches are costly and increase device development time.

SUMMARY

In one aspect, an electronic device includes a multilevel package substrate and a semiconductor die, where the multilevel package substrate has first and second levels in respective first and second planes of orthogonal first and second directions in a stack along an orthogonal third direction Z, the first level includes a first conductive feature, and the second level includes a second conductive feature, and the semiconductor die has a conductive peripheral terminal, a conductive interior terminal, a peripheral region, and an interior region. The interior region is inwardly spaced from lateral sides of the semiconductor die, the peripheral region laterally surrounds the interior region and extends laterally between the interior region and the lateral sides of the semiconductor die, the conductive peripheral terminal extends along the third direction from the peripheral region to the first level of the multilevel package substrate, and the conductive interior terminal is laterally spaced apart from the peripheral terminal and extends along the third direction from the interior region to the first level of the multilevel package substrate. The peripheral terminal is coupled to a peripheral contact portion of the first conductive feature, and the second level of the multilevel package substrate has no conductive feature under the peripheral contact portion of the first conductive feature.

In another aspect, a multilevel package substrate includes interior and peripheral regions, first and second levels, and dielectric material extending between the conductive features within and between the respective first and second levels. The interior region is inwardly spaced from lateral sides of the multilevel package substrate, the peripheral region laterally surrounds the interior region and extends laterally between the interior region and the lateral sides of the multilevel package substrate, and the first level has first conductive features and extending in a first plane of orthogonal first and second directions in the peripheral and interior regions. The second level has second conductive features in a second plane of the first and second directions in the peripheral and interior regions, the second level arranged with the first level in a stack along a third direction Z that is orthogonal to the first and second directions. A first instance of the first conductive features has a peripheral contact portion in the peripheral region and is adapted to be coupled to a conductive peripheral terminal of a semiconductor die, and the second level has no conductive feature under the peripheral contact portion of the first instance of the first conductive features.

In a further aspect, a method of fabricating an electronic device includes forming a multilevel package substrate by forming a first level having first conductive features and extending in a first plane of orthogonal first and second directions in peripheral and interior regions, where a first instance of the first conductive features has a peripheral contact portion in the peripheral region, and forming a second level having second conductive features in a second plane of the first and second directions in the peripheral and interior regions, the second level arranged with the first level in a stack along a third direction Z that is orthogonal to the first and second directions, where the second level has no conductive feature under the peripheral contact portion of the first instance of the first conductive features. The method further includes attaching a semiconductor die to the multilevel package substrate, electrically coupling a conductive peripheral terminal of the semiconductor die to the peripheral contact portion of the first instance of the first conductive features, and forming a package structure that encloses the semiconductor die and a portion of the multilevel package substrate.

BRIEF DESCRIPTION OF THE DRAWINGS

FIG. 2 is a flow diagram showing a method of fabricating an electronic device.

DETAILED DESCRIPTION

Figure 1:
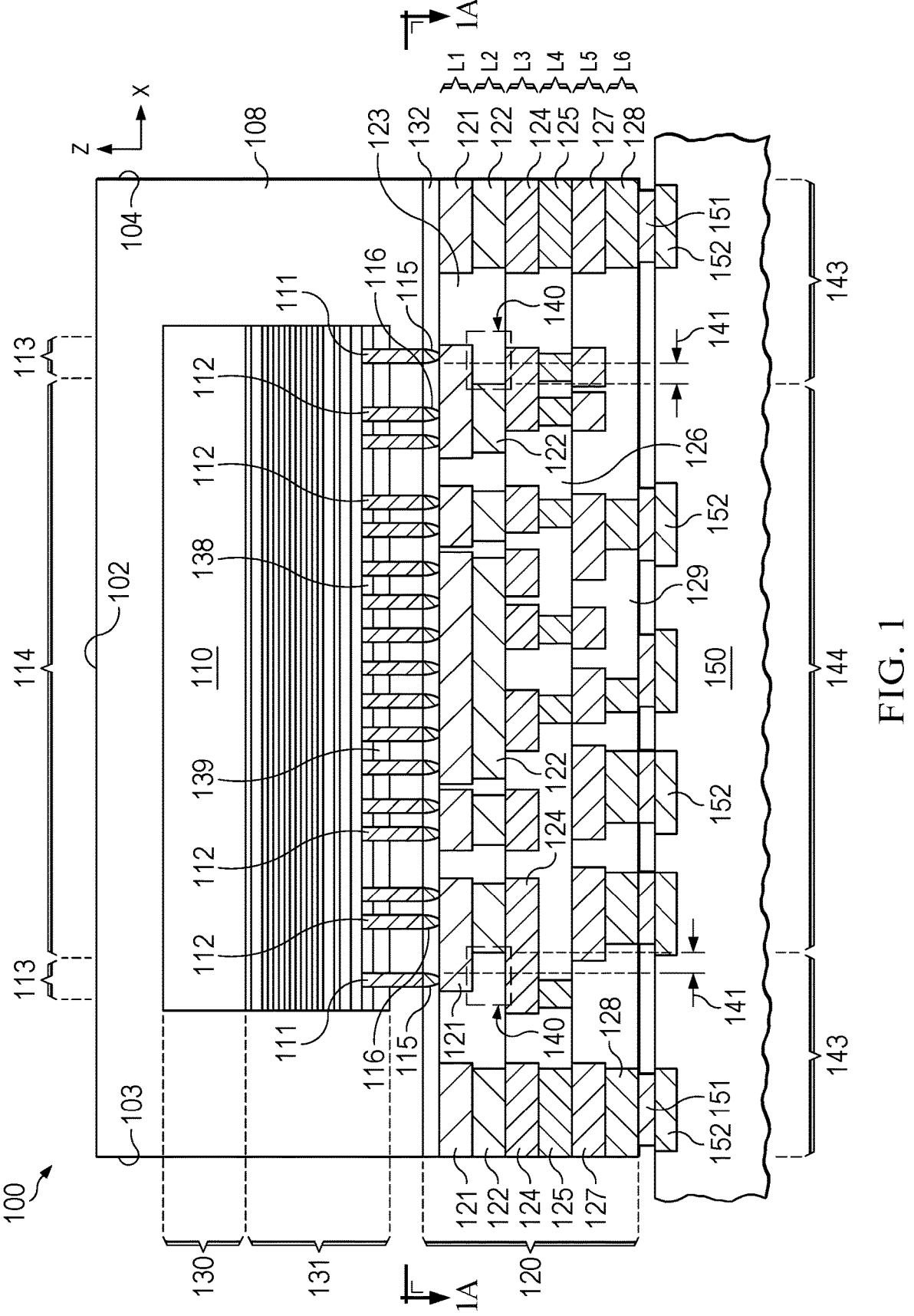
FIG. 1 is a sectional side elevation view of a packaged electronic device with a multilevel package substrate having top metal level structures under conductive peripheral terminals of a semiconductor die and no second level metal under the conductive peripheral terminals.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

Figure 1A:
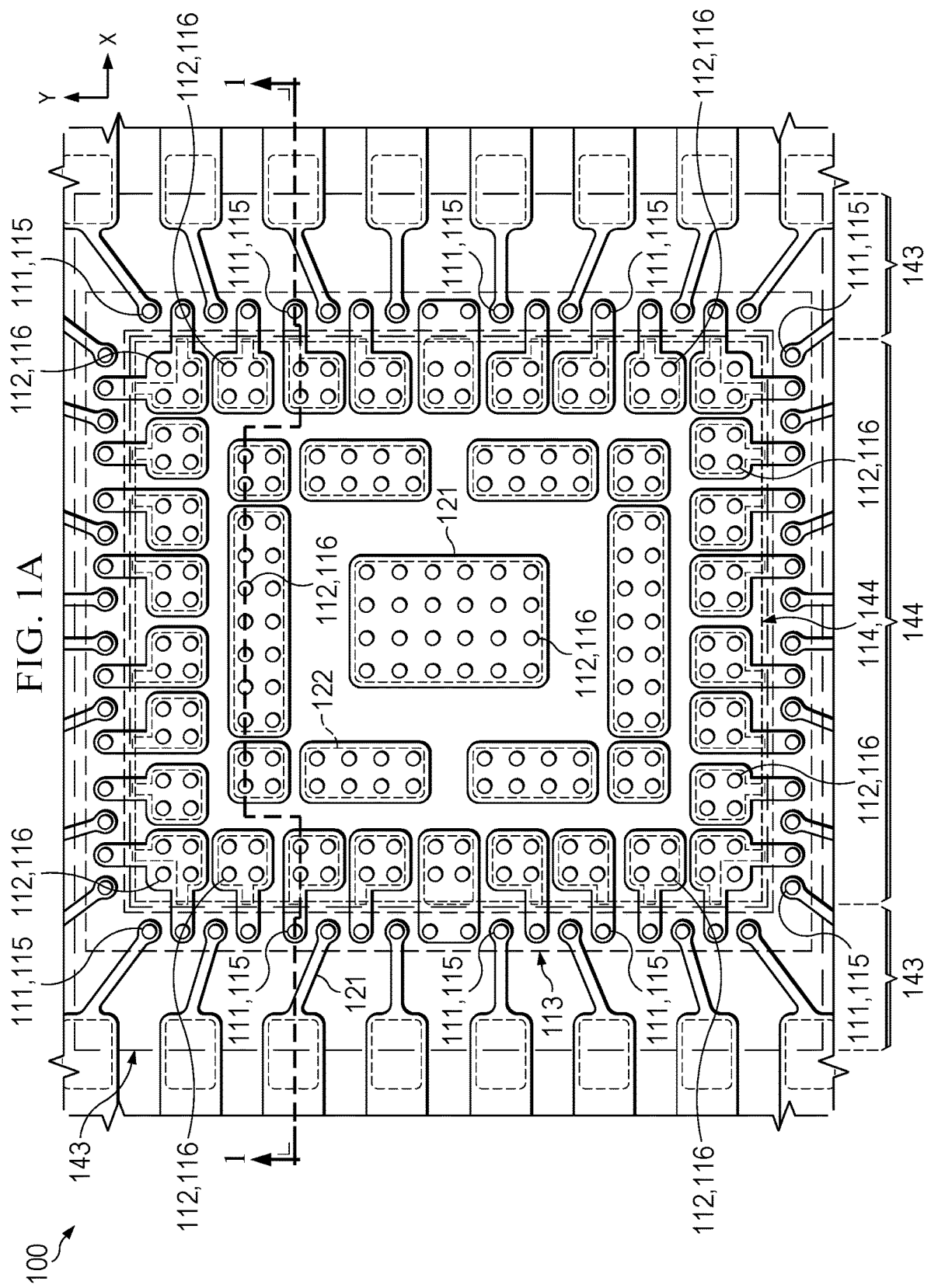
FIG. 1A is a partial top plan view of the multilevel package substrate.

FIGS. 1 and 1A show a packaged electronic device 100 having a multilevel package substrate 120 with top metal level structures under conductive peripheral terminals 111 (e.g., posts, pillars, solder bumps, etc.) proximate the periphery of a semiconductor die 110, and no second level metal under the conductive peripheral terminals 111. The absence of second level metal in the multilevel package substrate 120 under the conductive peripheral terminals 111 provides a low cost solution to mitigate die ILD interfacial delamination and cracking even during thermal cycling without adverse impact to electrical and thermal performance. The removal of select amounts of metal (e.g., copper) directly under the conductive peripheral terminals 111 can mitigate peeling stress (e.g., approximately 10%) in the die metallization structure 131 to reduce ILD cracking or delamination risk at no additional cost by design of the multilevel package substrate 120 without changing the design or performance of the semiconductor die 110 or modifying the manufacturing and assembly process.

The electronic device 100 in one example is a flip-chip chip scale package (FCCSP) device. Other device package forms and types can be used in other implementations, such as having leads formed from a starting lead frame and internal bond wire connections, flip chip ball grid array (FCBGA) devices, etc. FIG. 1 shows the electronic device 100 installed in a system, such as a smart phone, laptop or desktop computer, a tablet, an automotive system, an industrial system, etc. The electronic device 100 is shown in an example position or orientation in a three-dimensional space with a first direction X, a perpendicular (orthogonal) second direction Y (into the page, not numerically designated in FIG. 1), and a third direction Z that is perpendicular (orthogonal) to the respective first and second directions X and Y. Structures or features along any two of these directions are orthogonal to one another. As shown in FIG. 1, the electronic device 100 has a first (e.g., bottom) side and an opposite second (e.g., top) side 102, which are spaced apart from one another along the third direction Z, as well as laterally opposite third and fourth sides 103 and 104 that are spaced apart from one another along the first direction X and opposite fifth and sixth sides (not shown) that are spaced apart from one another along the second direction Y. The sides in one example have substantially planar outer surfaces. In other examples (not shown), one or more of the sides of the electronic device 100 have curves, angled features, or other non-planar surface features. The electronic device 100 has a package structure 108, such as a molded plastic structure that forms all or a portion of the second side and upper portions of the lateral sides.

The semiconductor die 110 is partially enclosed by the package structure 108 and the die 110 is flip chip attached (e.g., by solder connections) to the top side of the multilevel package substrate 120. The molded package structure 108 extends onto and encloses portion of a top side of the multilevel package substrate 120. The semiconductor die 110 has generally planar top and bottom sides with conductive peripheral terminals 111 and conductive interior terminals 112 along the bottom side of the die 110. The semiconductor die 110 includes one or more electrical circuit components (not shown). At least some of the conductive terminals 111 and/or 112 provide circuit connections to interconnect other external devices and/or components to a circuit of the electronic device 100 via the multilevel package substrate 120. The conductive terminals 111 and 112 in the illustrated examples are conductive metal pillars (e.g., copper, etc.) that extend outward from the bottom side of the semiconductor die 110. This facilitates flip-chip die attachment and soldering to form electrical connections to the circuitry of the electronic device 100.

As shown in FIGS. 1 and 1A, the semiconductor die 110 has a peripheral region 113 and an interior region 114. Any number of one or more conductive peripheral terminals 111 can be positioned anywhere in the peripheral region 113 and any number of one or more conductive interior terminals 112 can be positioned anywhere in the interior region 114. The interior region 114 is inwardly spaced from four lateral (e.g., outer) sides of the semiconductor die 110. The peripheral region 113 laterally surrounds the interior region 114 and extends laterally between the interior region 114 and the lateral sides of the semiconductor die 110. As shown in FIG. 1A, the conductive peripheral terminals 111 are positioned in the peripheral region 113 proximate the lateral sides of the semiconductor die 110. In this illustrated example, none of the conductive interior terminals 112 are closer to any lateral side of the semiconductor die 110 than any of the conductive peripheral terminals 111, although not required for all possible implementations. In another implementation, the conductive peripheral terminals 111 can be in the peripheral region 113 along fewer than all lateral sides of the semiconductor die 110. The conductive interior terminals 112 are positioned within the interior region 114 in multiple rows, although multiple rows are not required for all possible implementations.

The conductive peripheral terminals 111 in one example each have a solder cap 115 applied to the ends thereof and the conductive interior terminals 112 have a solder cap 116 applied to the ends thereof, for example, by electroplating during a bumping process or other suitable dipping, printing or other process to allow flip-chip attachment and thermal reflow to make electrical and mechanical connections thereto (e.g., connections to top metal features of the multilevel package substrate 120). FIG. 1A is a partial top plan view of the multilevel package substrate 120 taken along line 1A-1A of FIG. 1, including indications of the locations of the conductive terminals 111, 12 and associated solder portions 115, 116 for reference, and the sectional side view of FIG. 1 is taken along line 1-1 in FIG. 1A. In one example for flip chip, chip scale packages, the terminals 111 are copper pillars or posts formed by electroplating in a bumping process, which is followed by electroplating of the solder portions 115 and 116 on top of the respective copper peripheral and interior terminals 111 and 112 during the wafer bumping process. For FCBGAs, the flip chip side substrate pad or feature of the top metal level of the multilevel package substrate 120 can have solder as well as other finishes like OSP, ENEPIG, etc. The bump interconnect formed on a processed wafer in one example is or includes copper and a solder cap, which is subsequently attached to the package substrate 120 to form electrical interconnections of a circuit of the electronic device 100.

The multilevel package substrate 120 can have any number of two or more levels with respective patterned conductive metal features. As best shown in FIG. 1, the illustrated example has six levels formed in a stacked arrangement (e.g., a stack) including a top or first level L1, a second level L2 below the first level L1, a third level L3 below the second level L2, a fourth level L4 below the third level L3, a fifth level L5 below the fourth level LA, and a bottom or sixth level L6 below the fifth level L5. The first level L1 has patterned first conductive features 121 and extends in a first plane (e.g., an X-Y plane) of the first and second directions X and Y. The second level L2 has patterned second conductive features 122 in a second X-Y plane. A dielectric material 123 extends between the conductive features 121 and 122 within and between the respective first and second levels L1 and L2. The top view of FIG. 1A shows the first and second conductive features 121 and 122. The third level L3 has patterned third conductive features 124 in a third X-Y plane, the fourth level L4 has patterned fourth conductive features 125 in a fourth X-Y plane, and dielectric material 126 extends between the conductive features 124 and 125 within and between the respective levels L3 and L4. The fifth level L5 has patterned fifth conductive features 127 in a fifth X-Y plane, the sixth level L6 has patterned sixth conductive features 128 in a sixth X-Y plane, and dielectric material 129 extends between the conductive features 127 and 128 within and between the respective fifth and sixth levels L5 and L6. The illustrated example has dielectric layers 123, 126, and 129 that each extend in two adjacent levels. In other examples, each level can have an associated dielectric layer or different numbers and configurations of dielectric layers can be used. The illustrated example has one layer of conductive metal features in each level. In other examples, one or more levels can include two or more layers or sublevels of conductive metal features, such as trace and via structures in a given level. The conductive features 121, 122, 124, 125, 127, and 128 in one example are or include a conductive metal, such as copper, aluminum, etc.

As best shown in FIG. 1, the semiconductor die 110 has a semiconductor body 130 (e.g., silicon or other suitable semiconductor material) and a metallization structure 131 that extends over the semiconductor body 130. The metallization structure 131 extend from a protective overcoat layer 138 toward the semiconductor body 130 proximate the lateral sides of the semiconductor die 110. The protective overcoat layer 138 extends over the metallization structure 131. In one example, the protective overcoat layer 138 is or includes an inorganic-based passivation material, such as a silicon nitride (SiN), silicon oxynitride (SiO$_x$N$_y$), or silicon dioxide (SiO$_2$). An organic-based passivation layer, such as a polyimide layer 139 extends over the protective overcoat layer 138, and the conductive peripheral terminals 111 and conductive interior terminals 112 extend from the metallization structure 131 through the protective overcoat layer 138 and the polyimide layer 139.

As further shown in FIGS. 1 and 1A, the multilevel package substrate 120 has a peripheral region 143 and an interior region 144. The interior region 144 is inwardly spaced from lateral sides of the multilevel package substrate 120 and the peripheral region 143 laterally surrounds the interior region 144 and extends laterally between the interior region 144 and the lateral sides of the multilevel package substrate 120. In one example, the interior region 144 can generally correspond to the interior region 114 of the semiconductor die 110, although not a requirement of all possible implementations. In the illustrated example, the peripheral region 143 of the multilevel package substrate 120 is somewhat wider than the peripheral region 113 of the semiconductor die 110, although not a requirement of all possible implementations. In this example, moreover, the first conductive features 121 of the first level L1 extend in the respective peripheral and interior regions 143 and 144 and the second conductive features 122 extend in the second X-Y plane in the respective peripheral and interior regions 143 and 144.

As best shown in FIG. 1, the conductive peripheral terminals 111 on the left and right in FIG. 1 extend along the third direction Z from the peripheral region 113 of the semiconductor die 110 to the first level L1 of the multilevel package substrate 120, and the conductive interior terminals 112 along the illustrated side section view are laterally spaced apart from the peripheral terminals 111. In addition, the conductive interior terminals 112 extend along the third direction Z from the interior region 114 of the semiconductor die 110 to the first level L1 of the multilevel package substrate 120. A first instance of the first conductive features 121 (e.g., the right most feature 121 in the view of FIG. 1) has a top side that includes a peripheral contact portion in the peripheral region 143, which is adapted to be coupled to a conductive peripheral terminal 111 of the semiconductor die 110. A second instance of the first conductive features 121 (e.g., the left most feature 121 in the view of FIG. 1) has a top side that includes a corresponding peripheral contact portion in the peripheral region 143, which is also adapted to be coupled to a respective conductive peripheral terminal 111 of the semiconductor die 110. Moreover, the second level L2 has no conductive features under the peripheral contact portions of the first instance of the first conductive features 121. The conductive peripheral terminals 111 are coupled to the peripheral contact portion of respective first conductive features 121 of the top or first level L1.

The second level L2 of the multilevel package substrate 120 has no conductive features under the peripheral contact portions of these first and second instances of the conductive features 121, for example, in the circled areas 140 shown in FIG. 1. As further shown in FIG. 1, the nearest second conductive features 122 of the second level L2 are laterally spaced apart from the closest lateral edge of the respective conductive peripheral terminals 111 by a non-zero spacing distance 141. The top view of FIG. 1A further shows the location of the second level metal features 122 and the lateral spacing thereof from the conductive peripheral terminals 111. The areas 140 of the second substrate level L2 with no second level metal directly under the conductive peripheral terminals 111 along the third direction Z helps mitigate ILD interfacial delamination and cracking in the ILD material and metallization structure 131 of the semiconductor die 110. This provides advantages with respect to enhanced structural integrity during thermal cycling without adverse impact to electrical and thermal performance and without adding cost or complexity to the electronic device 100 and the processing used to make the electronic device 100.

The electronic device 100 in the example of FIG. 1 includes the third level L3 including outer instances of the third conductive feature 124 (e.g., under the circled areas 140). In this example, at least a portion of these instances of the third conductive feature 124 extend under the peripheral contact portion of the respective first conductive features 121 directly under the conductive peripheral terminals 111 along the third direction Z in the peripheral region 143 of the multilevel package substrate 120. In the illustrated example, moreover, at least some of the conductive interior terminals 112 are coupled to an interior contact portion of another respective conductive feature 121 of the first level L1 in the interior region 114. In one implementation, the second level L2 has a conductive feature 122 at least partially under the interior contact portion of one or more of the conductive feature 121 of the first level L1 in the interior region 144.

FIG. 1 shows a system implementation that includes the FCCSP electronic device 100 installed on a circuit board 150 in the system of FIG. 1, with respective ones of the substrate leads soldered via solder cap or solder paste 151 to respective ones of the conductive metal board pad 152 to provide mechanical and electrical connections to conductive metal board pads 152 of the circuit board 150. The circuit board 150 can be a component of a smart phone, laptop or desktop computer, a tablet, an automotive system, an industrial system, or other type of host system.

Referring now to FIGS. 2-20, FIG. 2 shows a method 200 of fabricating an electronic device and FIGS. 3-20 illustrate fabrication of the example electronic device 100 of FIGS. 1 and 1A according to an implementation of the method 200.

The method 200 includes forming a multilevel package substrate 120 at 201-203. FIGS. 3-16 show the multilevel package substrate 120 undergoing fabrication processing as a panel or array with multiple unit areas. The first level (e.g., level L1) is formed at 201 with patterned first conductive features 121, the second level (e.g., level L2) is formed at 202, and the third and subsequent levels (L3-L6) are optionally formed at 203. FIGS. 3-16 show one example, in which an electroplating steps are used to form patterned conductive features for two levels, followed by compression molding of insulator material and planarization for each level of the multilevel package substrate 120 of FIGS. 1-1C described above. The multilevel package substrate 120 provided and/or manufactured at 201-203 in FIG. 2 includes the above-described features with multiple conductive feature levels. In one implementation, the multilevel package substrate 120 is fabricated in a separate fabrication process and is provided as an input component (e.g., a panel or strip with rows and columns of unit areas) to a different manufacturing process for packaging along with the semiconductor die 110 in each unit area of the starting panel array. In another implementation, a single fabrication process creates the multilevel package substrate 120 and includes further processing to manufacture packaged semiconductor devices such as the electronic device 100.

In the illustrated example, the multilevel package substrate fabrication at 201-203 includes forming the first level L1 and the second level L2 with respective patterned conductive metal features 121 and 122 and a dielectric layer 123 on a carrier structure 302, and subsequently forming any subsequent levels (e.g., L3-L6) in pairs, after which the carrier structure 302 is removed from the first level. Following the fabrication of multiple rows and columns of the substrate panel array, the panel array is used as a component in the fabrication of a panel or array of the electronic devices 100. FIGS. 3-6 show formation of the first and second levels L1 and L2 at 201 and 202, respectively in one example, using electroplating processes and associated patterned plating masks. The illustrated example forms the patterned first conductive features 121 that form the first level L1 as a set of contiguous metal structures (e.g., electroplated metal that is or includes copper), as well as forming the second conductive features 122 and forming the dielectric layer 123 over the first conductive feature 121 and the second conductive features 122.

Figure 3:
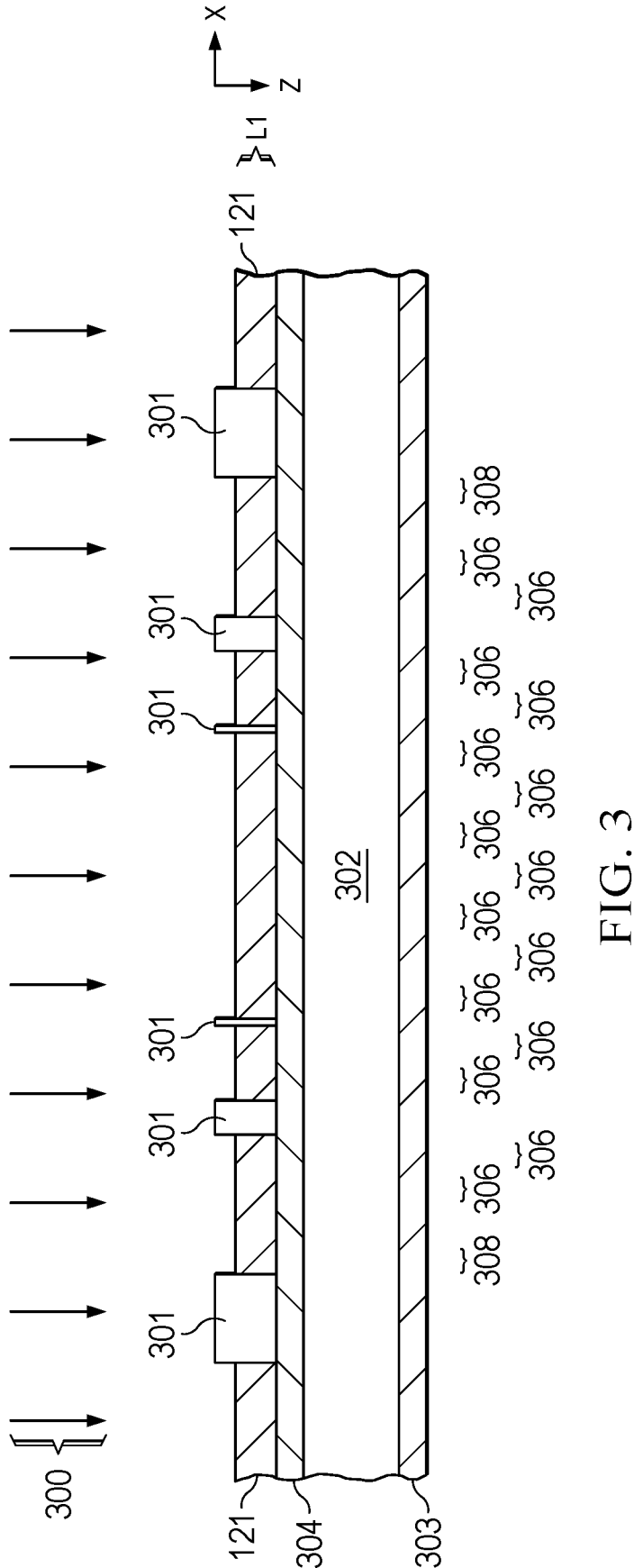
FIGS. 3-20 are partial sectional side elevation views showing the electronic device of FIGS. 1 and 1A undergoing fabrication processing according to the method of FIG. 2.
Figure 4:
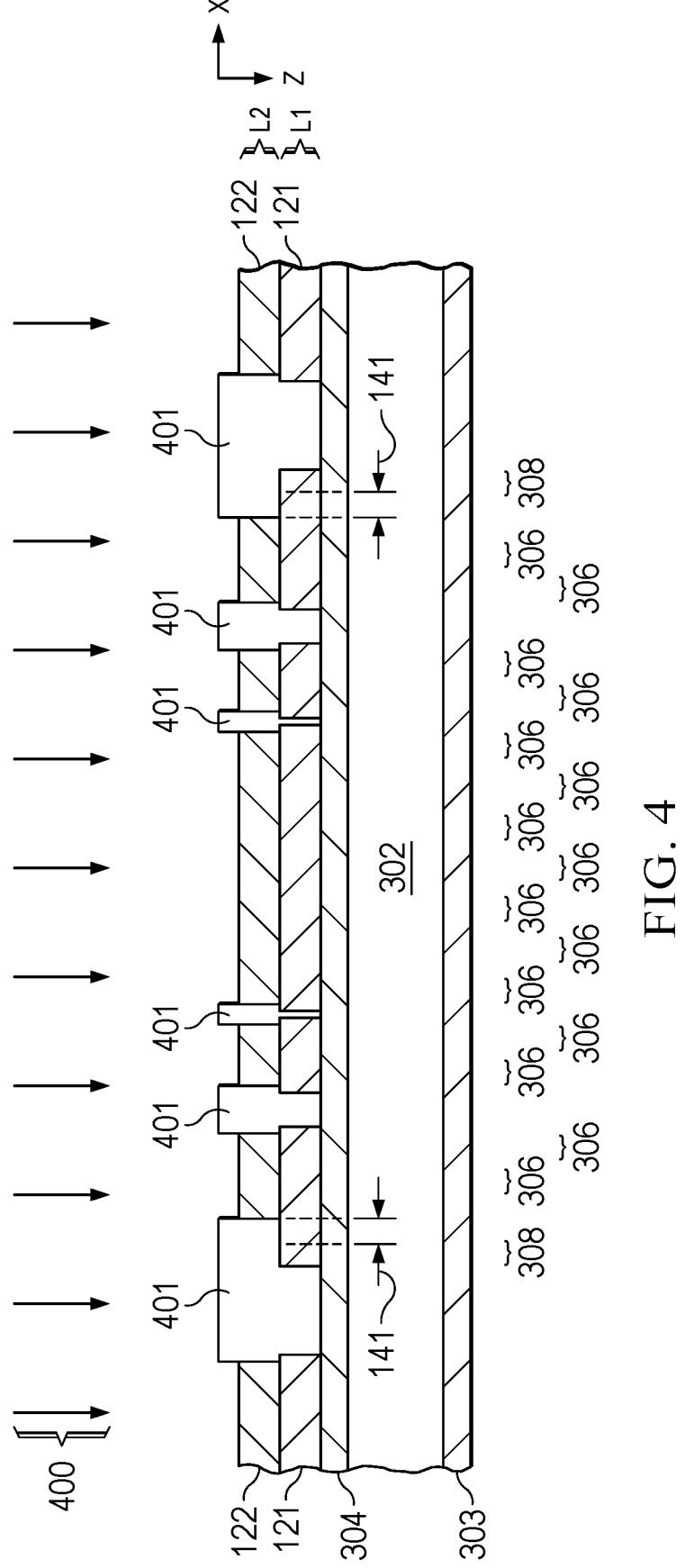
Figure 5:
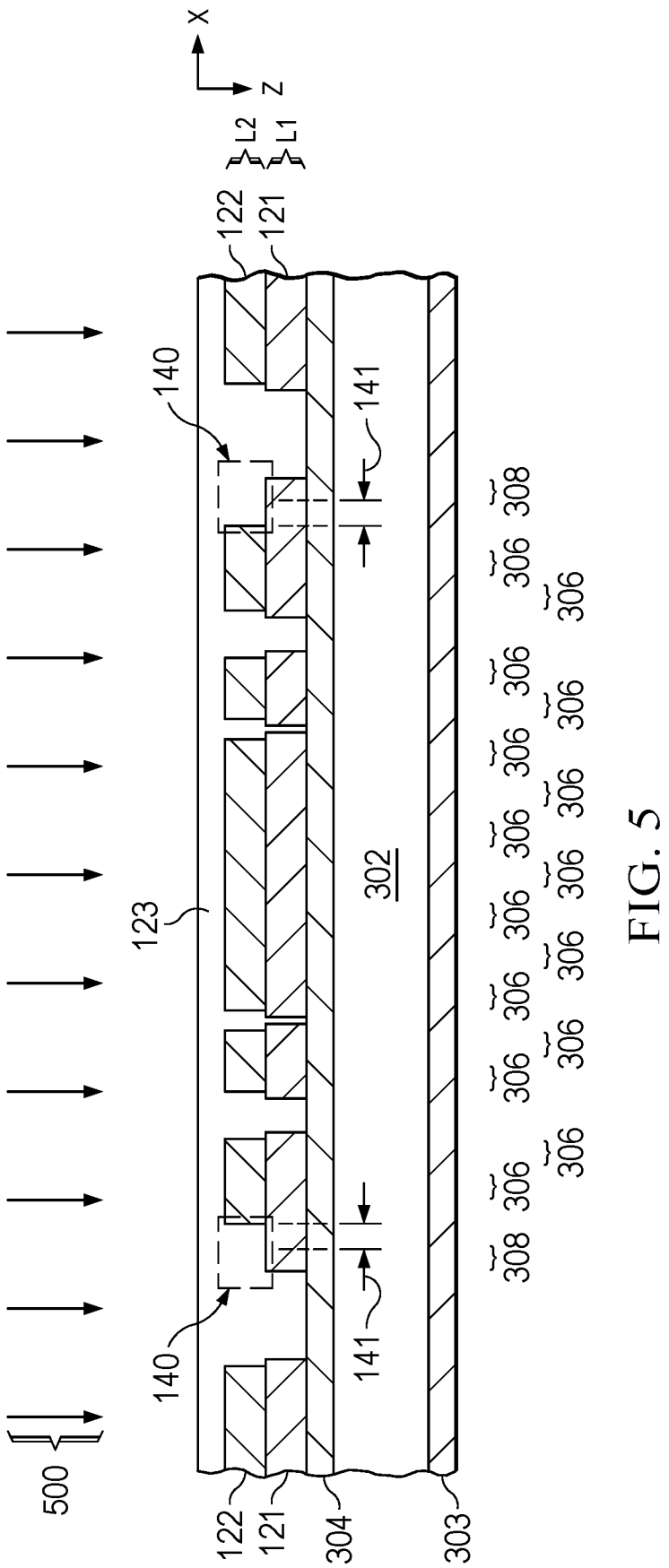

The first level formation at 201 starts with forming the first conductive features 121 by an electroplating process 300 using a patterned plating mask 301 using a stainless-steel carrier 302, such as a panel or strip with multiple prospective multilevel package substrate sections or unit areas, one of which is shown in FIG. 3. FIGS. 3-5 also illustrate the locations of prospective interior contact portion locations 306 of the first conductive structures 121 (e.g., in the prospective interior region 144 of the subsequently completed multilevel package substrate 120 as shown in FIGS. 1 and 1A above), as well as prospective peripheral contact portions 308 (e.g., in the prospective peripheral region 143). The plating process 300 in FIG. 3 forms the first conductive metal features 121 by electroplating copper. In other implementations, a different conductive metal can be used, such as aluminum or metals that include aluminum, etc. The carrier structure 302 in one example includes thin copper seed layers 303 and 304 formed by a blanket deposition process (not shown) such as chemical vapor deposition (CVD) on the respective bottom and top sides of the carrier structure 302 to facilitate subsequent electroplating the first conductive features 121 by the process 300. The electroplating process 300 deposits copper onto the upper copper seed layer 304 in the portions of the topside of the carrier structure 302 that are exposed through the patterned plating mask 301 to form the first patterned conductive features 121 extending in a first X-Y plane in peripheral and interior regions (e.g., 143 and 144 above), wherein a first instance of the first conductive features 121 has a peripheral contact portion in the peripheral region 143.

The method continues at 202 in FIG. 2 with forming the second level L2 having the second conductive features 122 in a second X-Y plane in the peripheral and interior regions. FIG. 4 shows the multilevel first package substrate 120 after the process 300 is completed and the plating mask 301 has been removed during formation of first conductive features 122. A second electroplating process 400 is performed in FIG. 4 using a patterned second plating mask 401. The electroplating process 400 deposits further copper onto exposed portions of the first traces 121 to form the second conductive features 122, where the second level L2 has no conductive feature under the peripheral contact portions 308 of the first conductive features 121. After the electroplating process 400 is completed, the second plating mask 401 is removed.

Figure 6:
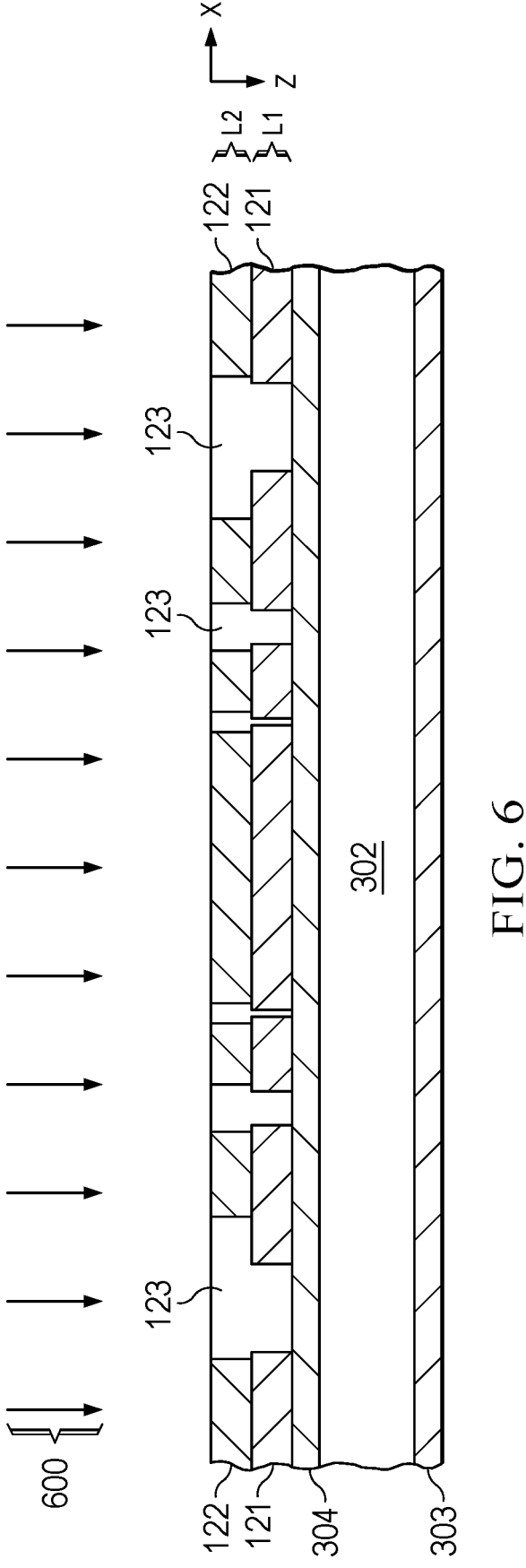
Figure 7:
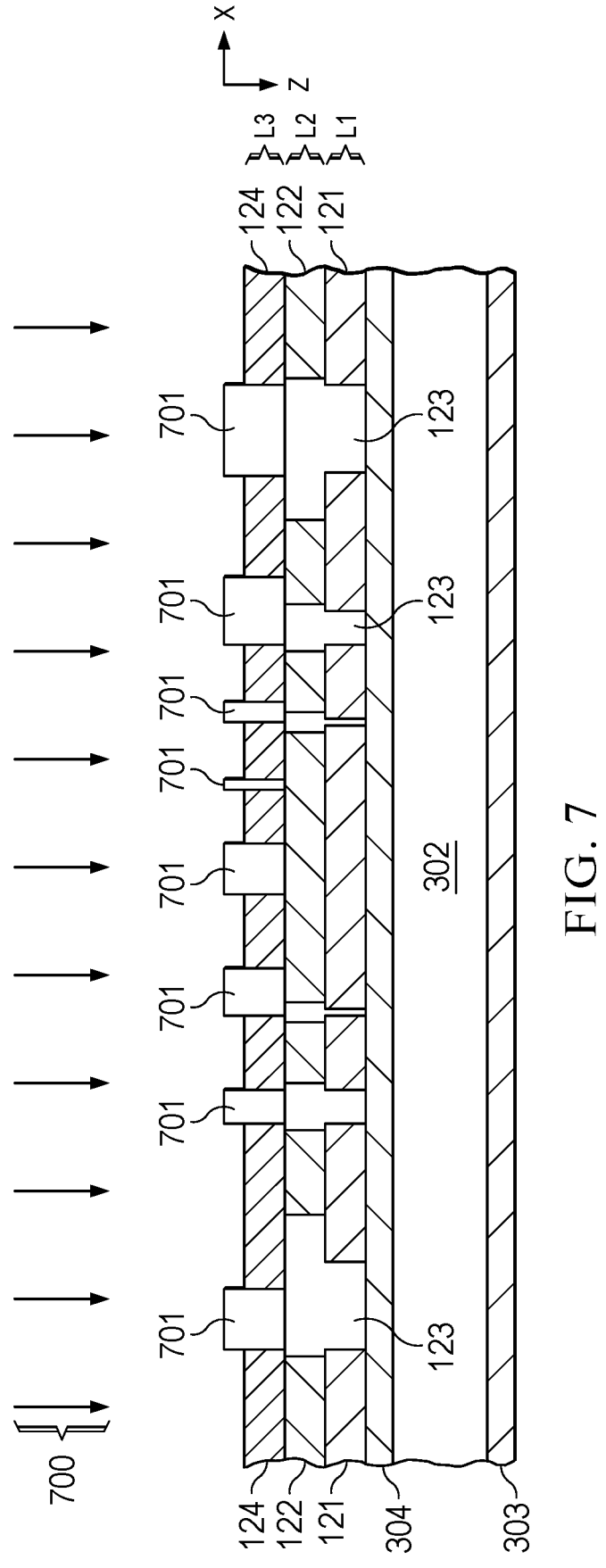

FIGS. 5 and 6 show formation of the first compression molded dielectric layer (e.g., insulator) features 123 in the first and second levels L1 and L2 of the multilevel package substrate 120. A compression molding process 500 is performed in FIG. 5 to form the molded dielectric layer features 123 on exposed portions of the conductive features 121 and 122 of the respective first and second levels. In other implementations, a different dielectric layer formation process can be used, such as a deposition process (not shown). The compression molding process 500 forms the molded dielectric layer features 123 in FIG. 5 to an initial thickness that covers the first and second conductive features 121 and 122. A grinding process 600 is performed in FIG. 6, which grinds upper portions of the molded dielectric material 123 and exposes the upper portions of the second conductive features 122. In another example, a chemical etch is used. In a further example, a chemical mechanical polishing (CMP) process is used. As shown in FIG. 6, the first dielectric layer 123 encloses a portion of the first traces 121.

Figure 8:
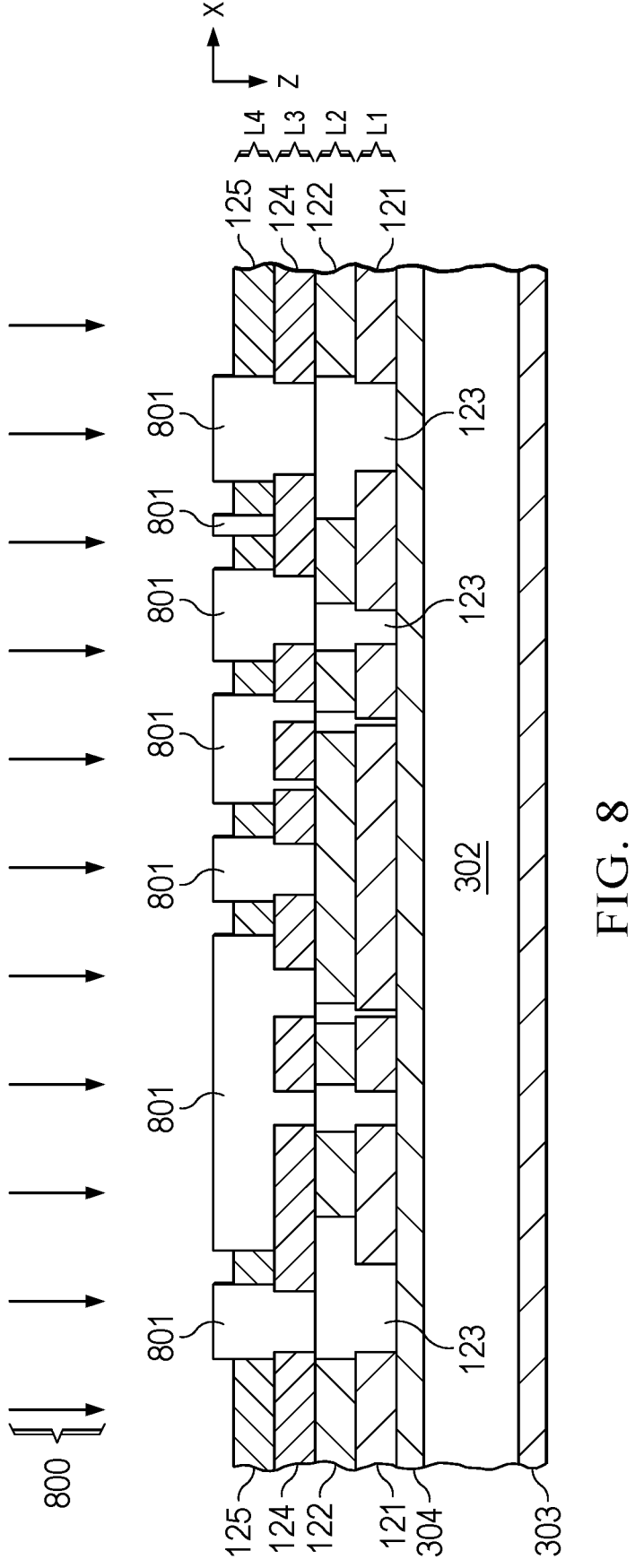

The illustrated implementation of the method 200 continues at 203 in FIG. 2 to form the third and subsequent levels L3-L6. FIGS. 7-10 show formation of the third and fourth levels of the multilevel package substrate 120 at 203 in FIG. 2, including forming the third conductive features 124 over the dielectric layer 123 and the second conductive features 122. In the illustrated example, a portion of an instance of the third conductive features 124 extends under the peripheral contact portion of the first instance of the first conductive features 121, although not a requirement of all possible implementations. In one example, the processing used to form the third level L3 is similar to that used to form the first level, although not a requirement of all possible implementations. In the illustrated example of FIG. 7, an electroplating process 700 is performed with a patterned plating mask 701. The electroplating process 700 deposits copper onto the top side of the portions of the finished second level L2 that are exposed through the plating mask 701 to form the third conductive features 124 of the third level L3. After the process 700 is completed, the plating mask 701 is removed. FIG. 8 shows the multilevel package substrate undergoing another electroplating process 800 using another plating mask 801 to form the fourth level LA. The electroplating process 800 deposits further copper to form the fourth conductive features 125 in the areas exposed by the plating mask 801. After the process 800 is completed, the plating mask 801 is removed.

Figure 9:
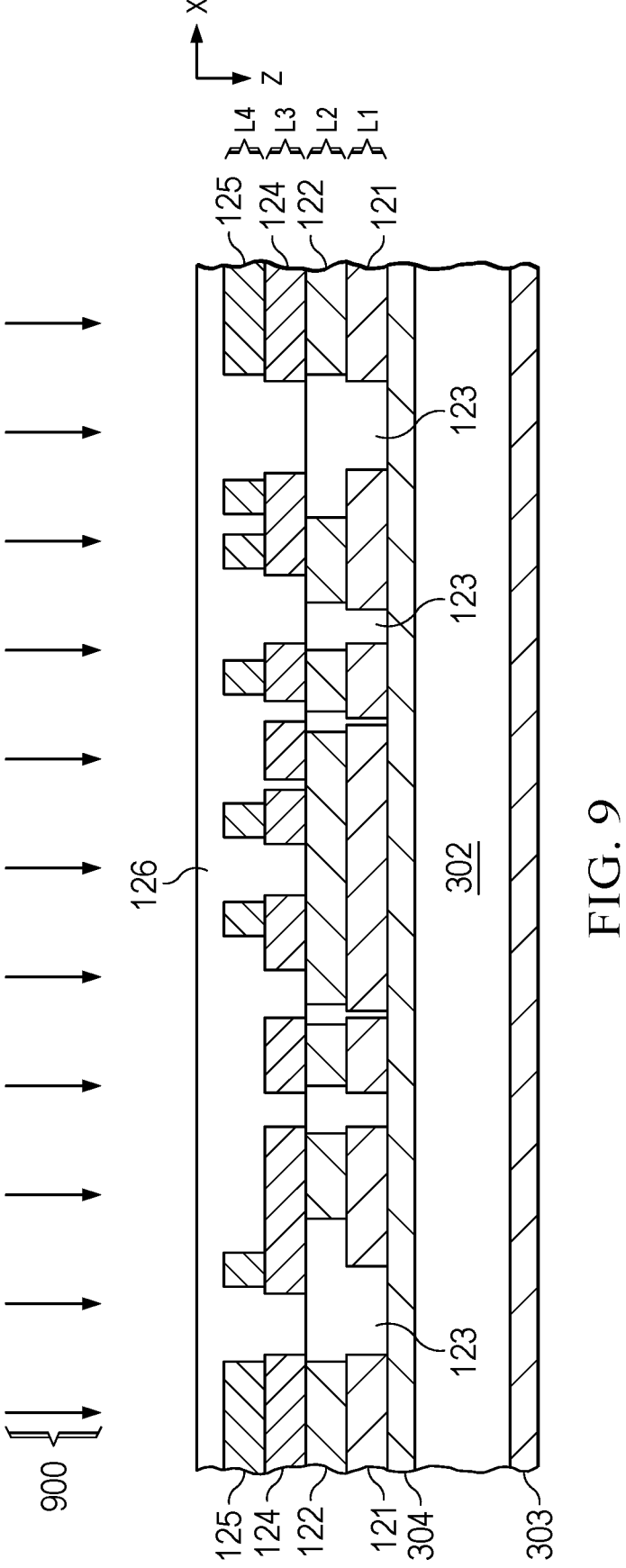
Figure 10:
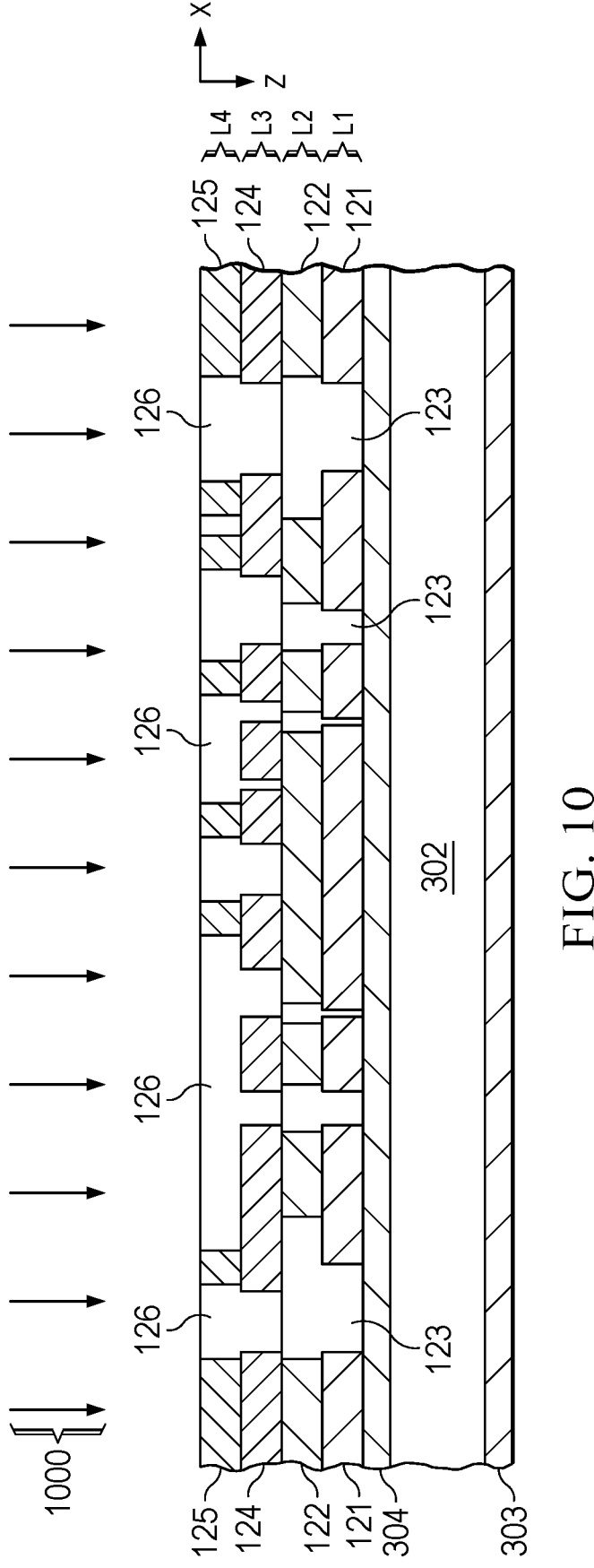
Figure 11:
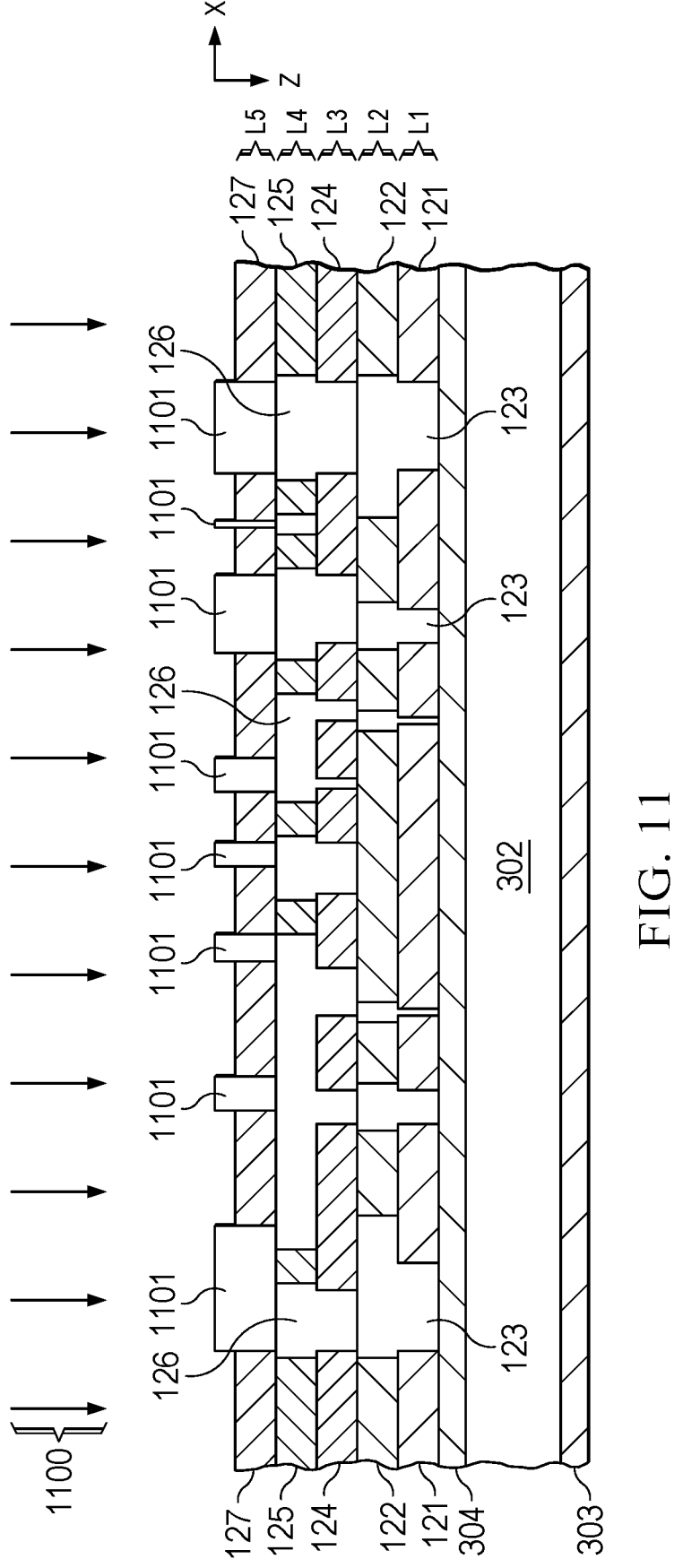

FIGS. 9 and 10 show formation of the second dielectric layer 126 in the third and fourth levels L3 and L4 using compression molding and grinding. A compression molding process 900 is performed in FIG. 9, which forms the second dielectric layer 126 on exposed portions of the conductive features 124 and 125 and any exposed portions of the first dielectric layer 123 to an initial thickness that covers the fourth conductive features 125. In other implementations, a different dielectric layer formation process can be used, such as a deposition process (not shown). A grinding process 1000 is performed in FIG. 10, which grinds upper portions of the second dielectric layer 126 and exposes the upper portions of the fourth conductive feature layer 125. In another example, a chemical etch is used. In a further example, a chemical mechanical polishing process is used.

Figure 12:
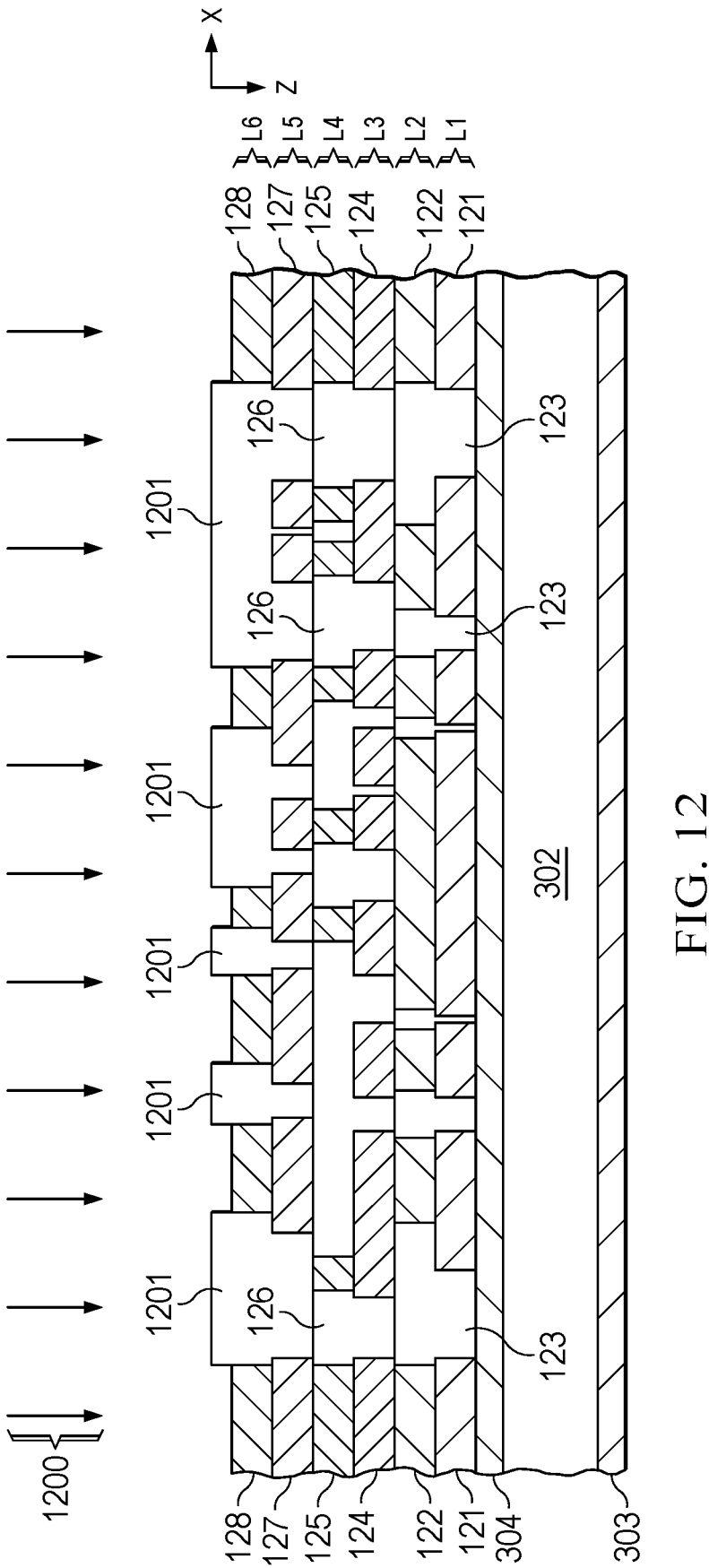

The illustrated implementation of the method 200 continues at 203 in FIG. 2 to form the fifth and sixth levels L5 and L6 at 203 in FIG. 2, including forming the fifth conductive features 127 over the dielectric layer 126 and the fourth conductive features 125. In one example, the processing used to form the fifth level L5 is similar to that used to form the first level, although not a requirement of all possible implementations. In the illustrated example of FIG. 11, an electroplating process 1100 is performed with a patterned plating mask 1101. The electroplating process 1100 deposits copper onto the top side of the portions of the finished fourth level L2 that are exposed through the plating mask 1101 to form the fifth conductive features 127 of the fifth level L3. After the process 1100 is completed, the plating mask 1101 is removed. FIG. 12 shows the multilevel package substrate undergoing another electroplating process 1200 using another plating mask 1201 to form the sixth level LA. The electroplating process 1200 deposits further copper to form the sixth conductive features 128 in the areas exposed by the plating mask 1201. After the process 1200 is completed, the plating mask 1201 is removed.

Figure 13:
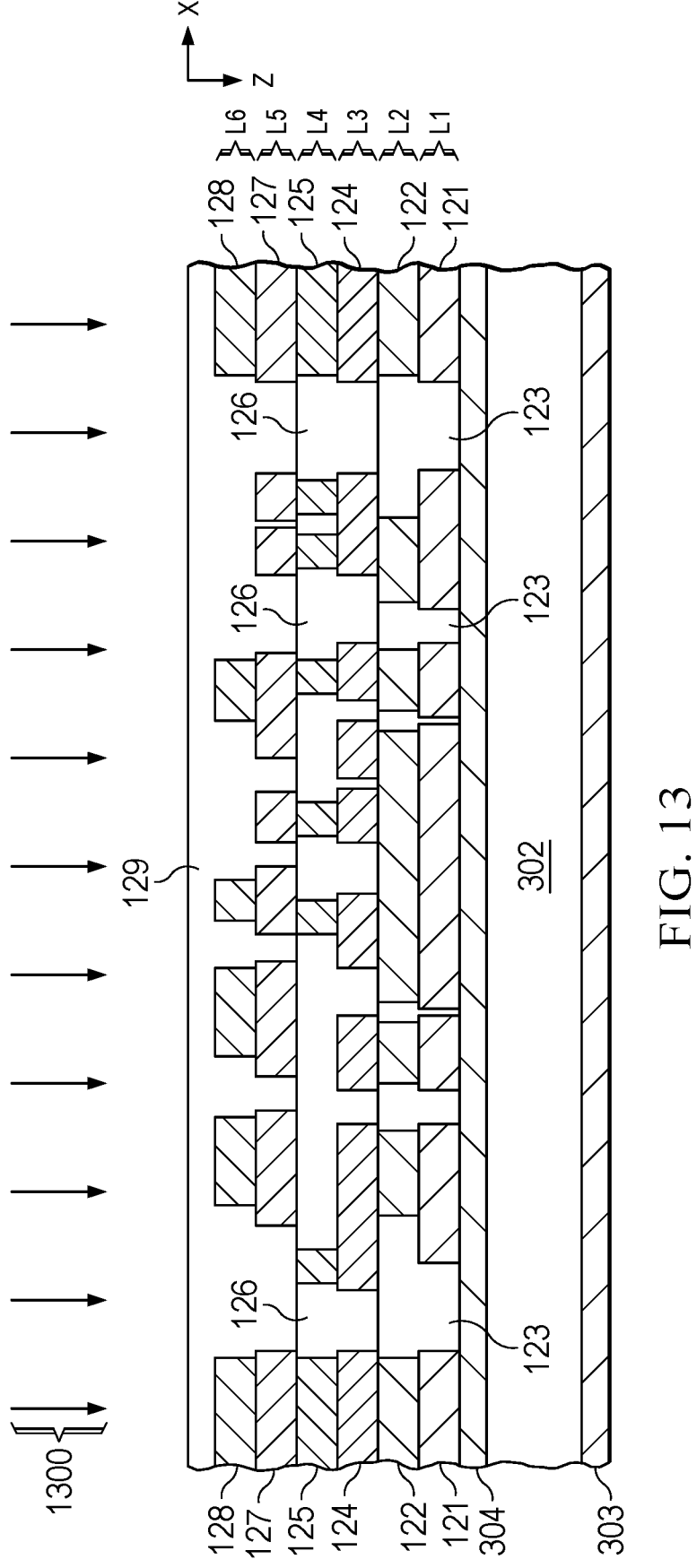
Figure 14:
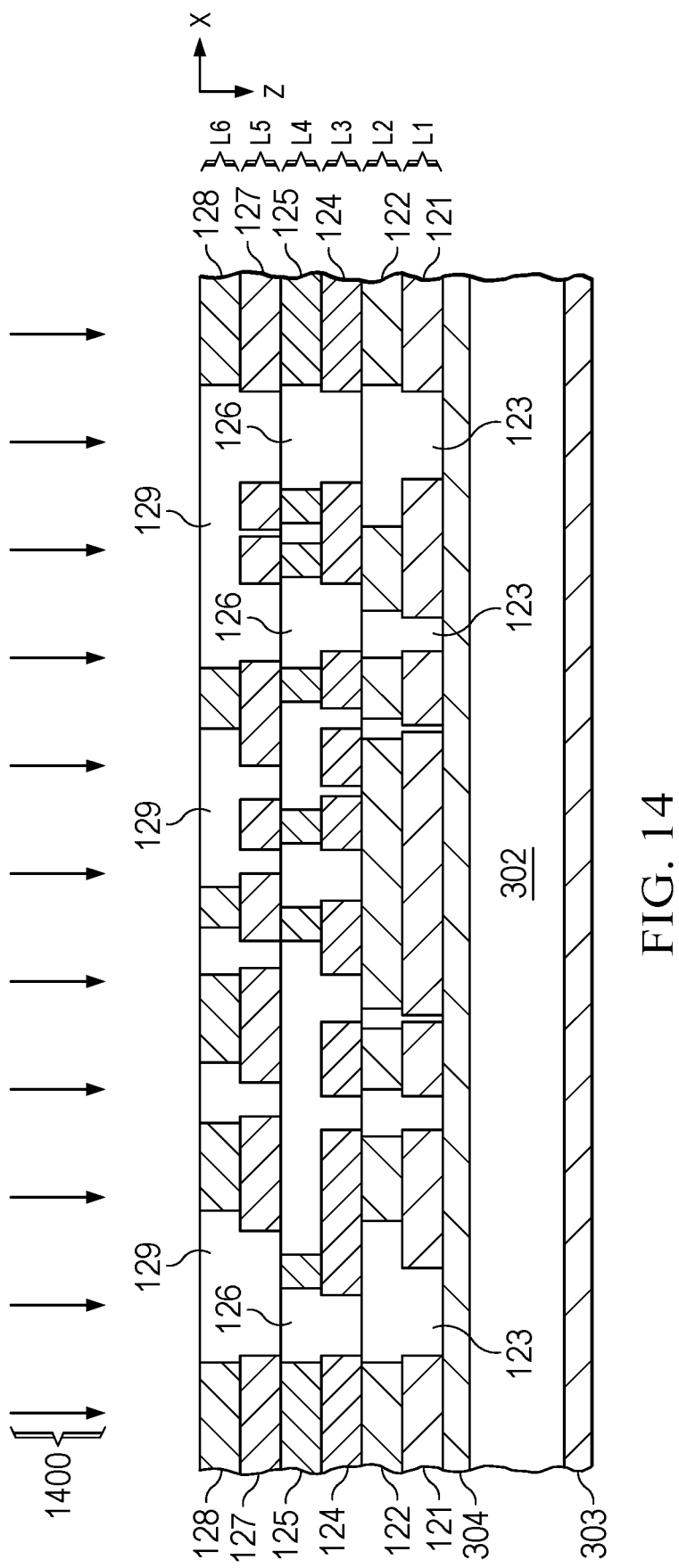
Figure 15:
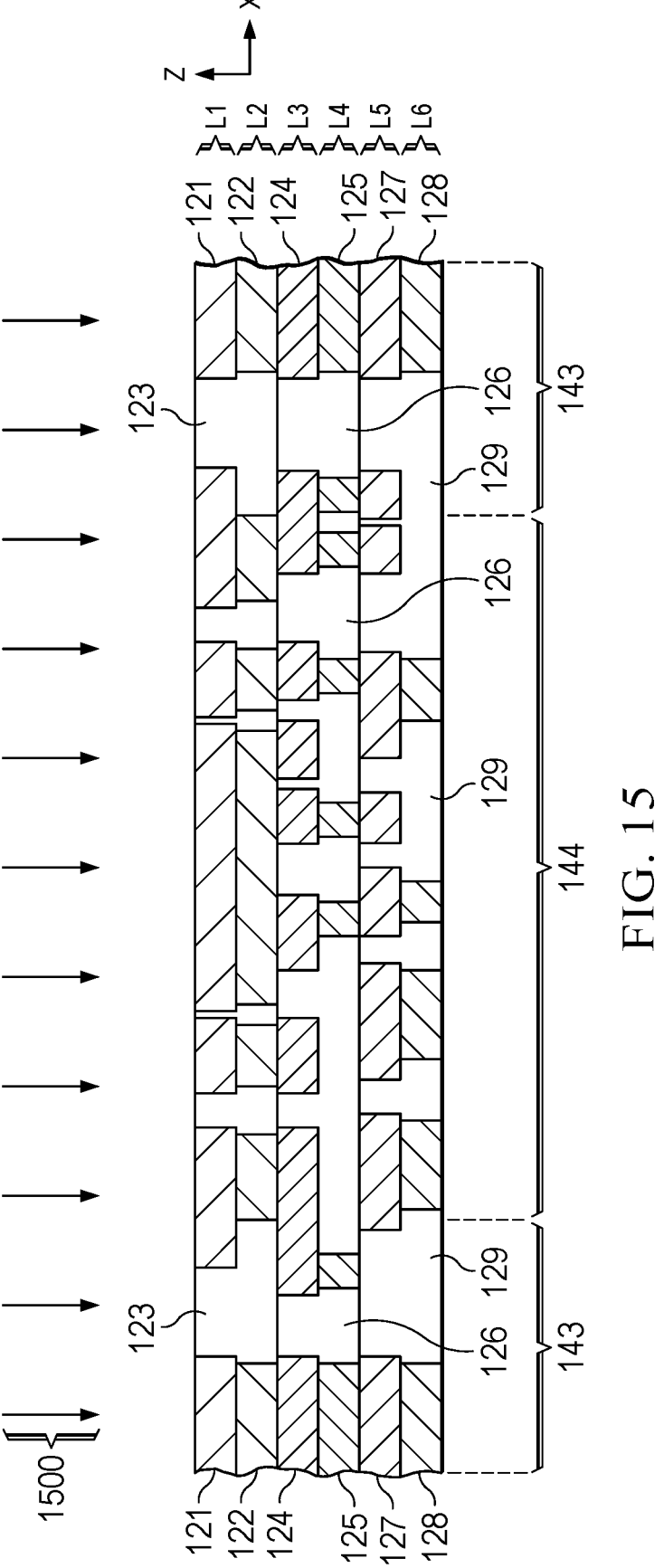
Figure 16:
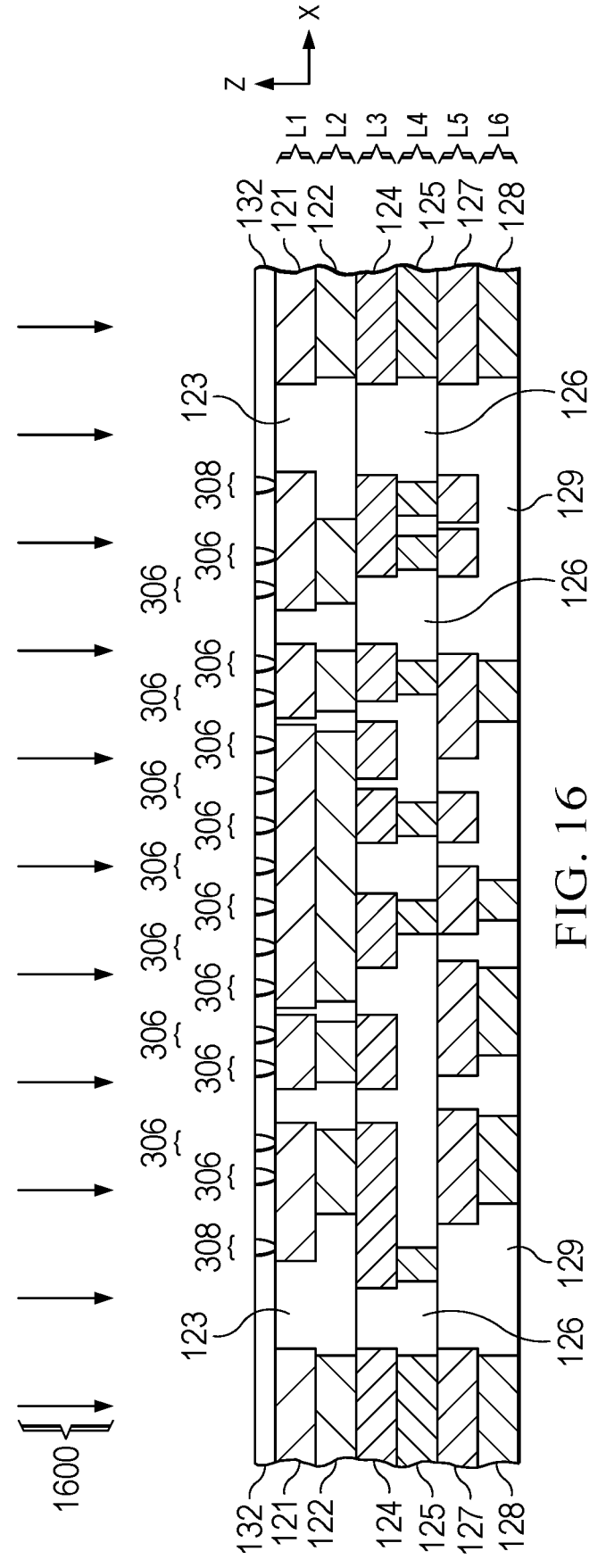

FIGS. 13 and 14 show formation of the third dielectric layer 129 in the fifth and sixth levels L3 and L4 using compression molding and grinding. A compression molding process 1300 is performed in FIG. 13, which forms the third dielectric layer 129 on exposed portions of the conductive features 127 and 128 and any exposed portions of the dielectric layer 126 to an initial thickness that covers the sixth conductive features 128. In other implementations, a different dielectric layer formation process can be used, such as a deposition process (not shown). A grinding process 1400 is performed in FIG. 14, which grinds upper portions of the third dielectric layer 129 and exposes the upper portions of the sixth conductive feature layer 128. In another example, a chemical etch is used. In a further example, a chemical mechanical polishing process is used. The carrier structure 302 is removed by an etching process 1500 in FIG. 15, and a patterned solder mask layer 132 can optionally be formed by a process 1600 shown in FIG. 16 to form the solder mask with openings at the prospective interior contact portion locations 306 of the first conductive structures 121 (e.g., in the prospective interior region 144 of the subsequently completed multilevel package substrate 120 as shown in FIGS. 1 and 1A above), as well as prospective peripheral contact portions 308 (e.g., in the prospective peripheral region 143).

Figure 17:
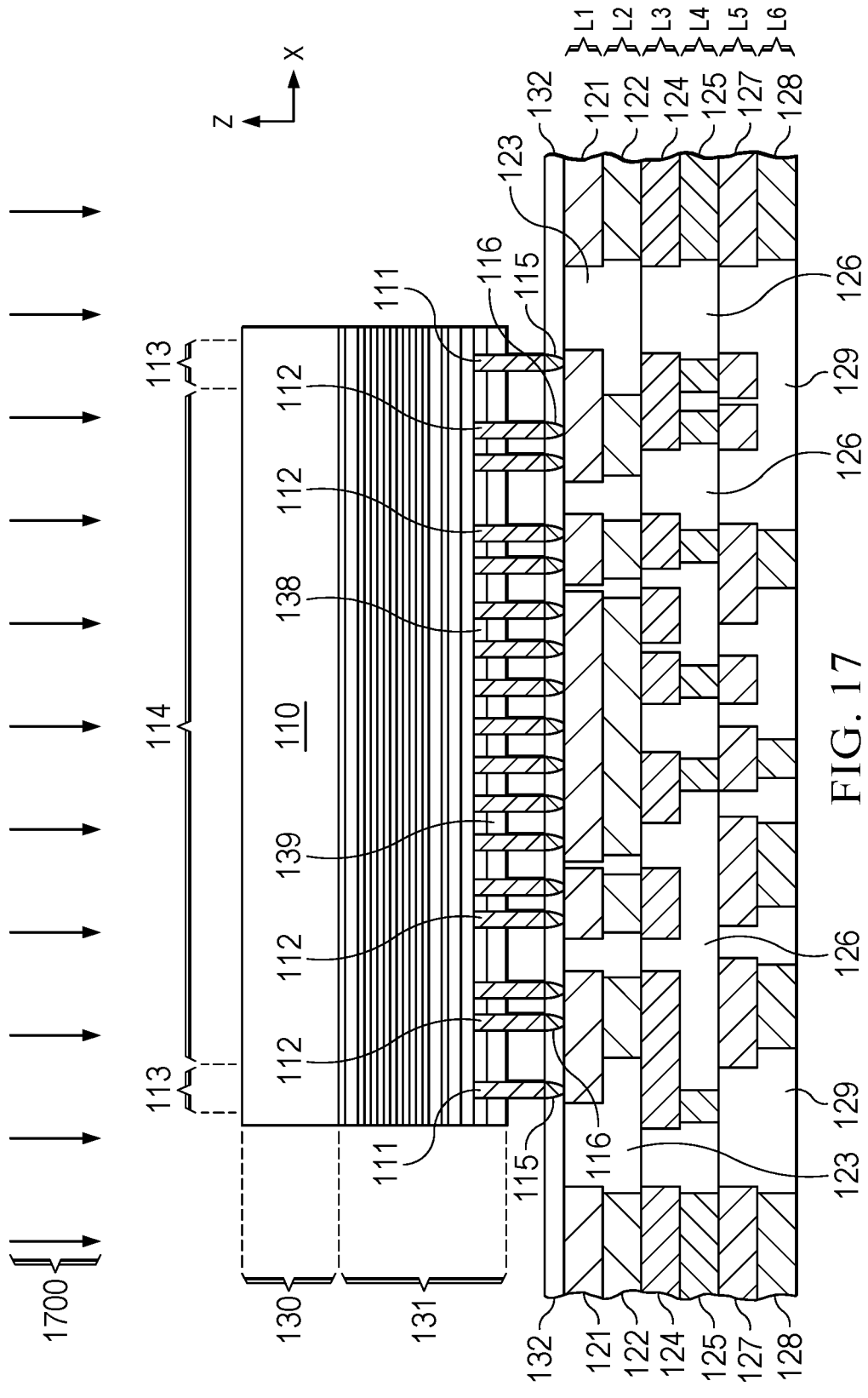
Figure 18:
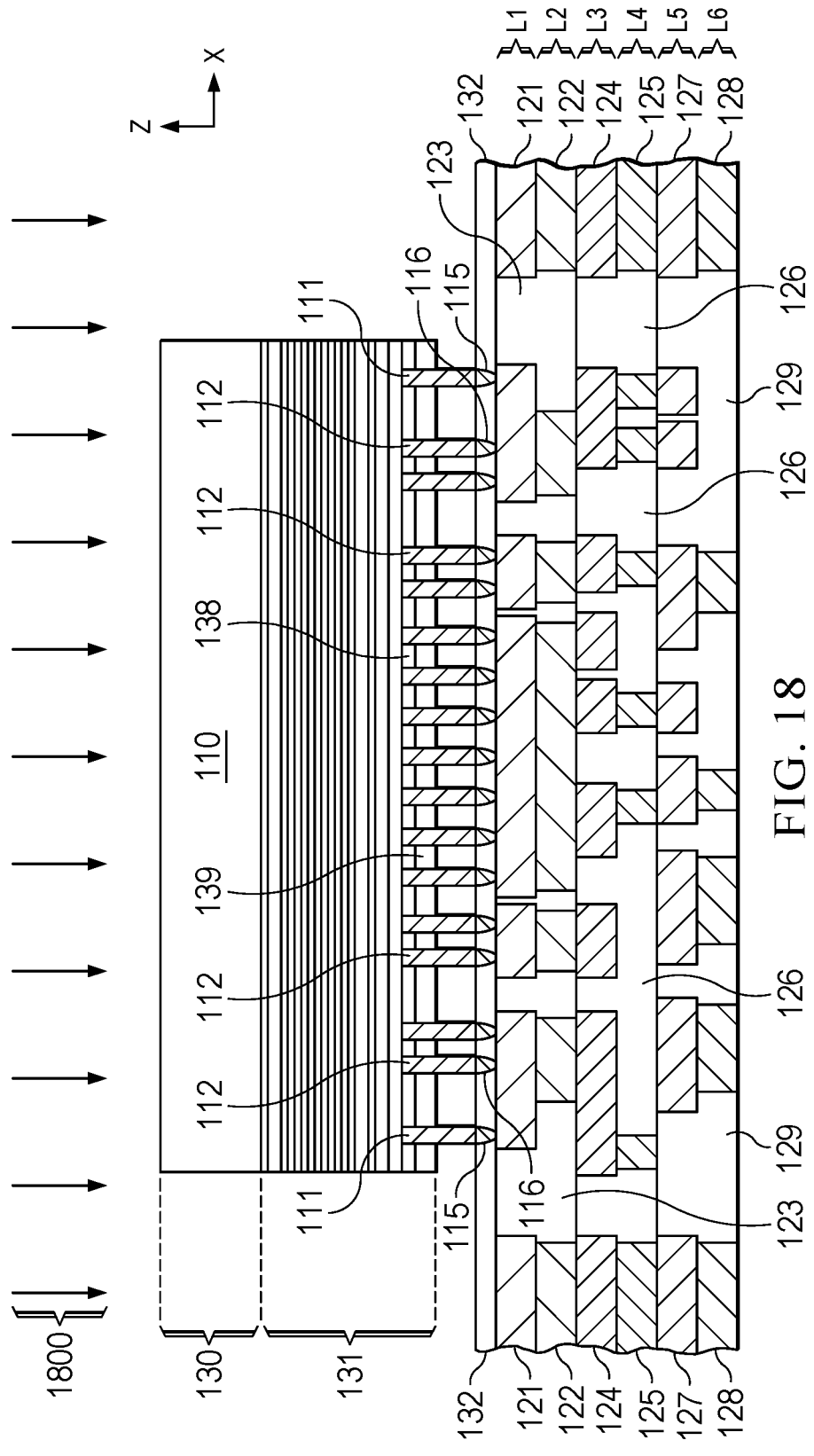

The method 200 continues at 204 in FIG. 2 with flip chip die attach processing to attach the semiconductor die 110 to the multilevel package substrate 120. FIGS. 17-20 show the electronic device undergoing fabrication processing using the multilevel package substrate 120 of FIG. 15 (e.g., without the optional solder mask). At 204 in FIG. 2, the semiconductor die 110 is attached to the multilevel package substrate 120, and electrical connections are formed at 206. In the illustrated example, the semiconductor die 110 is flip chip soldered to respective traces of the first level L1 of the multilevel package substrate 120 at 204 and 206. In another implementation, further components (e.g., additional semiconductor dies, passive components, etc., not shown) can be attached and electrically connected to the substrate 120 at 204 and 206. FIG. 17 shows one example, in which a die attach process 1700 is performed that attaches the semiconductor die 110 to the multilevel package substrate 120, for example, using automated pick and place equipment (not shown). In one implementation, bottoms of the conductive terminals 111 and 112 (e.g., copper pillars) of the semiconductor die 110 are dipped in solder to form the solder portions 115 and 116, and the semiconductor die 110 is positioned as shown in FIG. 17 with the conductive terminals 111 and 112 and associated solder placed on respective portions of the first conductive features 121 of the first level L1 of the multilevel package substrate 120. A thermal reflow process is performed at 206 of FIG. 2, an example of which is shown in FIG. 18, in which a thermal process 1800 is performed that heats and reflows the solder 115, 116 to form solder connections between the respective conductive terminals 111 and 112 of the semiconductor die 110 and the respective conductive features 121 of the first level L1 of the multilevel package substrate 120, including electrically coupling the conductive peripheral terminals 111 of the semiconductor die 110 to the peripheral contact portion of the respective instances of the first conductive features 121 in the peripheral regions 113 and 143

Figure 19:
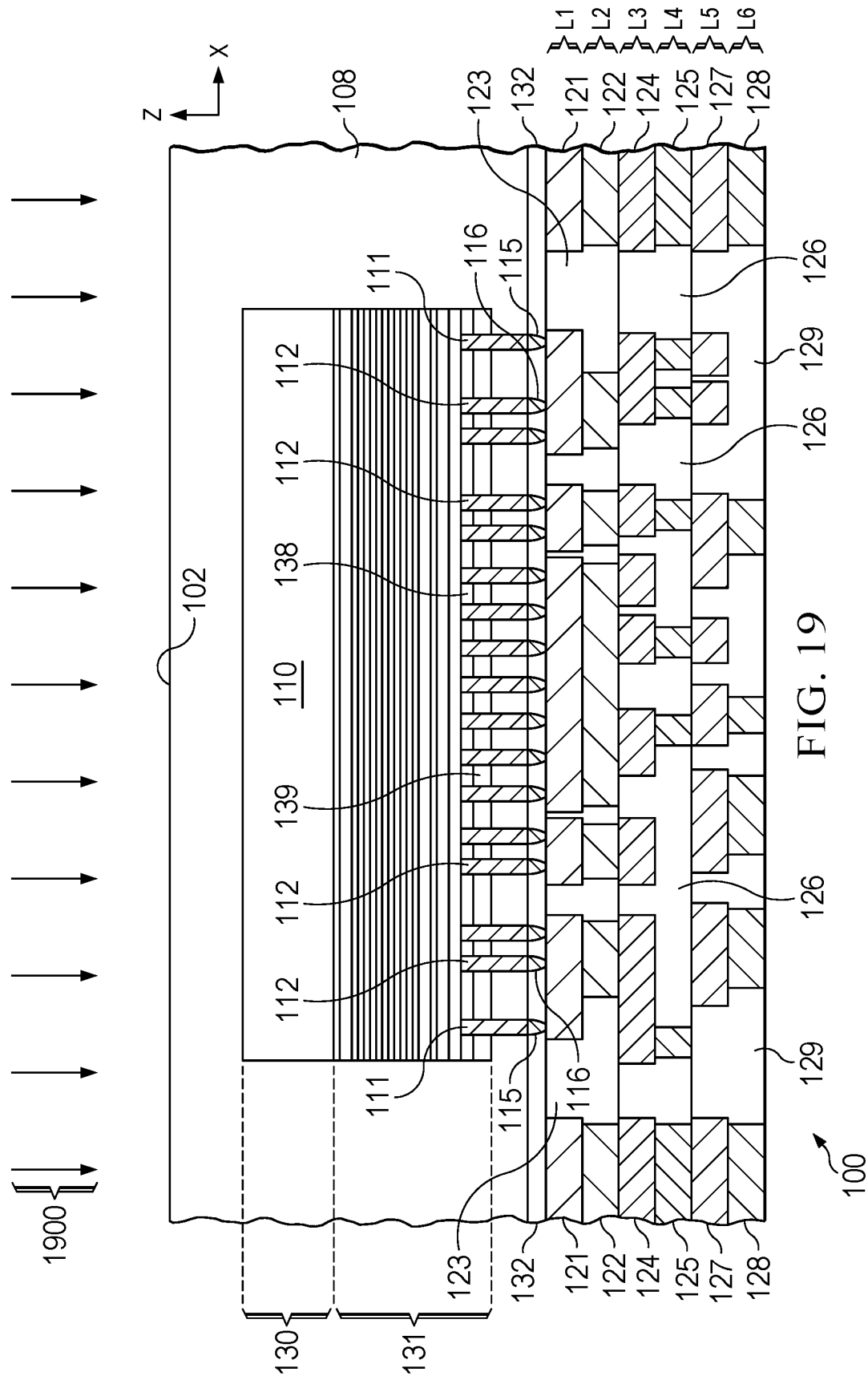
Figure 20:
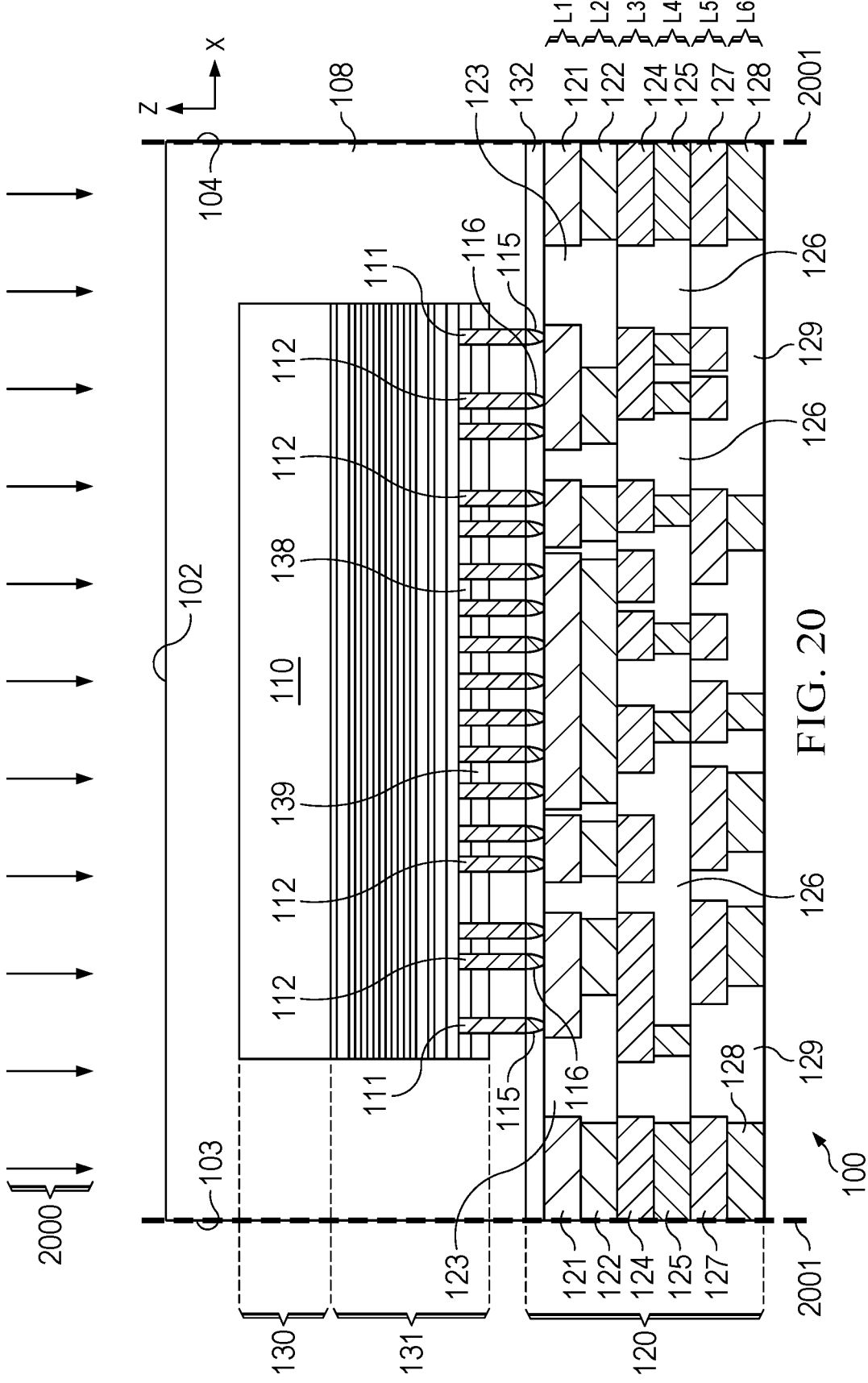

The method 200 continues at 208 with molding operations. FIG. 19 shows one example, in which a molding process 1900 is performed that forms a molded plastic package structure 108 that encloses the semiconductor die 110 and the exposed top side of the multilevel package substrate 120. The method 200 in one example also includes package separation at 210 in FIG. 2. FIG. 20 shows one example, in which a package separation process 2000 is performed that separates individual packaged electronic devices 100 from a panel array, for example, using saw or laser cutting. As shown in FIG. 20, the separation process 2000 in one example includes cutting along lines 2001 that are parallel to the second direction Y to form the device sides 103 and 104, and similar cutting operations are used along cut lines parallel to the first direction X to form the front and back sides (not shown) of the individual electronic devices 100. The resulting packaged electronic device 100 is shown in FIGS. 1 and 1A as discussed above.

Modifications are possible in the described examples, and other implementations are possible, within the scope of the claims.

What is claimed is:

1. An electronic device, comprising:

a multilevel package substrate having first, second and third levels in respective first and second planes of orthogonal first and second directions in a stack along a third direction Z that is orthogonal to the first and second directions, the first level including a first conductive feature, the second level including a second conductive feature, and the third level including a third conductive feature;

a semiconductor die having a conductive peripheral terminal, a conductive interior terminal, a peripheral region, and an interior region; and wherein the interior region is inwardly spaced from lateral sides of the semiconductor die, the peripheral region laterally surrounds the interior region and extends laterally between the interior region and the lateral sides of the semiconductor die, the conductive periph- eral terminal extends along the third direction from the peripheral region to the first level of the multilevel package substrate, the conductive interior terminal is laterally spaced apart from the peripheral terminal and extends along the third direction from the interior region to the first level of the multilevel package substrate, the peripheral terminal is coupled to a periph- eral contact portion of the first conductive feature, and the second level of the multilevel package substrate has no conductive feature under the peripheral contact portion of the first conductive feature, and the third level of the multilevel package has a conductive feature at least a portion of which is under the peripheral contact portion of the first conductive feature.

2. The electronic device of claim 1, comprising a package structure that encloses the semiconductor die and a portion of the multilevel package substrate.

3. The electronic device of claim 1, wherein the multilevel package substrate comprises more than three levels.

4. The electronic device of claim 1, wherein the first and second conductive features of the respective first and second levels include copper.

5. The electronic device of claim 1, wherein the multilevel package substrate has dielectric material extending between the conductive feature within and between the respective first and second levels.

6. An electronic device, comprising:
a multilevel package substrate having first and second levels in respective first and second planes of orthogo- nal first and second directions in a stack along a third direction Z that is orthogonal to the first and second directions, the first level including a first conductive feature, and the second level including a second con- ductive feature, and a third level in a third plane of the first and second directions, the second level between the first and third levels along the third direction, and the third level including a third conductive feature;
a semiconductor die having a conductive peripheral ter- minal, a conductive interior terminal, a peripheral region, and an interior region;
wherein the interior region is inwardly spaced from lateral sides of the semiconductor die, the peripheral region laterally surrounds the interior region and extends laterally between the interior region and the lateral sides of the semiconductor die, the conductive periph- eral terminal extends along the third direction from the peripheral region to the first level of the multilevel package substrate, the conductive interior terminal is laterally spaced apart from the peripheral terminal and extends along the third direction from the interior region to the first level of the multilevel package substrate, the peripheral terminal is coupled to a periph- eral contact portion of the first conductive feature, and the second level of the multilevel package substrate has no conductive feature under the peripheral contact portion of the first conductive feature; and
wherein a portion of the third conductive feature extends under the peripheral contact portion of the first con- ductive feature.

7. An electronic device, comprising:
a multilevel package substrate having first and second levels in respective first and second planes of orthogonal first and second directions in a stack along a third direction Z that is orthogonal to the first and second directions, the first level including a first conductive feature, and the second level including a second con- ductive feature; and
a semiconductor die having a conductive peripheral ter- minal, a conductive interior terminal coupled to an interior contact portion of another conductive feature of the first level, a peripheral region, and an interior region;
wherein the interior region is inwardly spaced from lateral sides of the semiconductor die, the peripheral region laterally surrounds the interior region and extends laterally between the interior region and the lateral sides of the semiconductor die, the conductive periph- eral terminal extends along the third direction from the peripheral region to the first level of the multilevel package substrate, the conductive interior terminal is laterally spaced apart from the peripheral terminal and extends along the third direction from the interior region to the first level of the multilevel package substrate, the peripheral terminal is coupled to a periph- eral contact portion of the first conductive feature, and the second level of the multilevel package substrate has no conductive feature under the peripheral contact portion of the first conductive feature.

8. The electronic device of claim 7, wherein the second level of the multilevel package substrate has a conductive feature at least partially under the interior contact portion of the other conductive feature of the first level.

9. A multilevel package substrate, comprising:
an interior region inwardly spaced from lateral sides of the multilevel package substrate;
a peripheral region that laterally surrounds the interior region and extends laterally between the interior region and the lateral sides of the multilevel package substrate;
a first level having first conductive features extending in a first plane of orthogonal first and second directions in the peripheral and interior regions;
a second level having second conductive features in a second plane of the first and second directions in the peripheral and interior regions, the second level arranged with the first level in a stack along a third direction Z that is orthogonal to the first and second directions;
a third level having third conductive features in a third plane of the first and second directions in the peripheral and interior regions;
dielectric material extending between the conductive fea- tures within and between the respective first, second and third levels; and
wherein a first instance of the first conductive features has a peripheral contact portion in the peripheral region and adapted to be coupled to a conductive peripheral ter- minal of a semiconductor die, the second level has no conductive feature under the peripheral contact portion of the first instance of the first conductive features, and the third level of the multilevel package has a conduc- tive feature at least a portion of which is under the peripheral contact portion of the first conductive fea- ture.

10. The multilevel package substrate of claim 9, wherein the multilevel package substrate comprises more than three levels.

11. A multilevel package substrate, comprising:
an interior region inwardly spaced from lateral sides of the multilevel package substrate;

a peripheral region that laterally surrounds the interior region and extends laterally between the interior region and the lateral sides of the multilevel package substrate;

a first level having first conductive features extending in a first plane of orthogonal first and second directions in the peripheral and interior regions;

a second level having second conductive features in a second plane of the first and second directions in the peripheral and interior regions, the second level arranged with the first level in a stack along a third direction Z that is orthogonal to the first and second directions; and dielectric material extending between the conductive features within and between the respective first and second levels;

wherein a first instance of the first conductive features has a peripheral contact portion in the peripheral region and adapted to be coupled to a conductive peripheral terminal of a semiconductor die, and the second level has no conductive feature under the peripheral contact portion of the first instance of the first conductive features;

wherein the multilevel package substrate comprises more than two levels, including a third level in a third plane of the first and second directions, the second level between the first and third levels along the third direction, and the third level including third conductive features; and wherein a portion of the third conductive feature extends under the peripheral contact portion of the first instance of the first conductive features.

12. The multilevel package substrate of claim 9, wherein a second instance of the first conductive features has an interior contact portion in the interior region and adapted to be coupled to a conductive interior terminal of the semiconductor die.

13. The multilevel package substrate of claim 12, wherein the second level of the multilevel package substrate has a second instance of the second conductive features that is at least partially under the interior contact portion of the second instance of the first conductive features of the first level.

14. The multilevel package substrate of claim 9, wherein the first and second conductive features of the respective first and second levels include copper.

15. A method of fabricating an electronic device, the method comprising:

forming a multilevel package substrate, including:

forming a first level having first conductive features and extending in a first plane of orthogonal first and second directions in peripheral and interior regions, wherein a first instance of the first conductive features has a peripheral contact portion in the peripheral region;

forming a second level having second conductive features in a second plane of the first and second directions in the peripheral and interior regions, the second level arranged with the first level in a stack along a third direction Z that is orthogonal to the first and second directions, wherein the second level has no conductive feature under the peripheral contact portion of the first instance of the first conductive features; and forming a third level having third conductive features in a third plane of the first and second directions in the peripheral and interior regions, at least a portion of one of the third conductive features being under the peripheral contact portion of one of the first conductive features;

attaching a semiconductor die to the multilevel package substrate;

electrically coupling a conductive peripheral terminal of the semiconductor die to the peripheral contact portion of the first instance of the first conductive features; and forming a package structure that encloses the semiconductor die and a portion of the multilevel package substrate.

16. The method of claim 15, wherein forming the multilevel package substrate further includes forming more than three levels in the stack.

17. The method of claim 15, wherein a second instance of the first conductive features has an interior contact portion in the interior region; the method further comprising electrically coupling a conductive interior terminal of the semiconductor die to the interior contact portion of the second instance of the first conductive features of the first level.

18. The method of claim 17, wherein the second level of the multilevel package substrate has a second instance of the second conductive features that is at least partially under the interior contact portion of the second instance of the first conductive features of the first level.

19. The method of claim 15, wherein forming the multilevel package substrate further includes forming dielectric material extending between the conductive feature within and between the respective first and second levels.

20. A method of fabricating an electronic device, the method comprising:

forming a multilevel package substrate, including:

forming a first level having first conductive features and extending in a first plane of orthogonal first and second directions in peripheral and interior regions, wherein a first instance of the first conductive features has a peripheral contact portion in the peripheral region; and forming a second level having second conductive features in a second plane of the first and second directions in the peripheral and interior regions, the second level arranged with the first level in a stack along a third direction Z that is orthogonal to the first and second directions, wherein the second level has no conductive feature under the peripheral contact portion of the first instance of the first conductive features;

forming a third level in the stack with the second level between the first and third levels along the third direction, and the third level including third conductive features, wherein a portion of an instance of the third conductive features extends under the peripheral contact portion of the first instance of the first conductive features;

attaching a semiconductor die to the multilevel package substrate;

electrically coupling a conductive peripheral terminal of the semiconductor die to the peripheral contact portion of the first instance of the first conductive features; and forming a package structure that encloses the semiconductor die and a portion of the multilevel package substrate.

* * * * *